(12) United States Patent
Ober et al.

(10) Patent No.: US 8,809,111 B2
(45) Date of Patent: Aug. 19, 2014

(54) METHODS OF MAKING PATTERNED STRUCTURES OF FLUORINE-CONTAINING POLYMERIC MATERIALS AND FLUORINE-CONTAINING POLYMERS

(75) Inventors: Christopher Ober, Ithaca, NY (US); George Malliaras, Batiment Aramis I (FR); Jin-Kyun Lee, Incheon (KR); Hon Hang Fong, Ithaca, NY (US)

(73) Assignee: Cornell University, Ithaca, NY (US)

( * ) Notice: Subject to any disclaimer, the term of this patent is extended or adjusted under 35 U.S.C. 154(b) by 287 days.

(21) Appl. No.: 13/502,584

(22) PCT Filed: Oct. 20, 2010

(86) PCT No.: PCT/US2010/053356
§ 371 (c)(1),
(2), (4) Date: Aug. 21, 2012

(87) PCT Pub. No.: WO2011/050048
PCT Pub. Date: Apr. 28, 2011

(65) Prior Publication Data
US 2012/0305897 A1  Dec. 6, 2012

Related U.S. Application Data

(60) Provisional application No. 61/253,381, filed on Oct. 20, 2009.

(51) Int. Cl.
*H01L 51/40* (2006.01)

(52) U.S. Cl.
USPC ............... 438/99; 257/40; 257/E51.001

(58) Field of Classification Search
USPC ............... 257/40, E51.001; 438/99
See application file for complete search history.

(56) References Cited

U.S. PATENT DOCUMENTS

| | | |
|---|---|---|
| 2003/0036618 A1 | 2/2003 | Maeda et al. |
| 2003/0129534 A1 | 7/2003 | Yamazaki et al. |
| 2004/0062930 A1 | 4/2004 | Roberts et al. |

FOREIGN PATENT DOCUMENTS

| | | |
|---|---|---|
| EP | 0364740 A2 | 4/1990 |
| EP | 0680078 A2 | 11/1995 |
| EP | 1261044 A2 | 11/2002 |
| WO | 2007057664 A2 | 5/2007 |
| WO | 2011004198 A2 | 11/2011 |

*Primary Examiner* — Anthony Ho
(74) *Attorney, Agent, or Firm* — Hodgson Russ LLP

(57) ABSTRACT

Methods and compositions for obtaining patterned structures comprising fluorine-containing polymeric materials. The fluorine-containing polymeric materials have sufficient fluorine content such that the materials can be patterned using conventional photolithographic/pattern transfer methods and maintain desirable mechanical and physical properties. The patterned structures can be used, for example, in light-emitting devices.

20 Claims, 13 Drawing Sheets

METHODS OF MAKING PATTERNED STRUCTURES OF FLUORINE-CONTAINING POLYMERIC MATERIALS AND FLUORINE-CONTAINING POLYMERS

CROSS-REFERENCE TO RELATED APPLICATIONS

This application claims priority to U.S. provisional patent application No. 61/253,381, filed Oct. 20, 2009, the disclosure of which is incorporated herein by reference.

STATEMENT REGARDING FEDERALLY SPONSORED RESEARCH

This invention was made with government support under contract no. DMR-0602821 awarded by the National Science Foundation. The government has certain rights in the invention.

FIELD OF THE INVENTION

The present invention generally relates to patterning of fluorine-containing materials and patterned structures of fluorine-containing materials. More particularly, the present invention relates to lithography-based patterning of fluorine-containing polymeric materials.

BACKGROUND OF THE INVENTION

Since the recent discovery of electroluminescence (EL) in both small organic molecules and conjugated polymers, organic and polymeric light-emitting diodes (OLEDs and PLEDs) have been a focus of organic electronics. In order for these devices to be integrated into displays, it is required to pattern the light-emitting materials into small, multi-layered elements for full-color visualization. While OLEDs rely on vapor deposition of small molecules, PLEDs can access a wider range of options if suitable processing methods are available. Solutions of conjugated polymers can be dispensed onto the desired area by ink jet printing or screen printing, or form films on regions where a sacrificial photoresist material defines the target. Although the photolithographic methods are in principle more efficient and possess higher resolution, they have not been recognized as suitable for PLEDs. There has been concern that organic solvents used in photoresist deposition and stripping harm the integrity of the active organic materials. This challenge has motivated the identification of new lithographic processes where less damaging solvents are employed.

Solution processing of organic electronic materials is a highly attractive processing option for many applications, particularly organic light emitting diodes (OLEDs) for display and solid-state lighting. It is a low cost approach with no limitations with regard to substrate size. While highly efficient full color displays are rather straightforward to fabricate via vacuum-assisted shadow mask deposition of organic small molecules, it is challenging to achieve solution-processed full color displays due to the limitations imposed by compatibility issues among active light-emitting components and other chemicals and solvents used in the device patterning process.

Much work has been done on the patterning of organic electronic materials, However, patterning techniques such as inkjet printing and screen printing suffer from the disadvantages of low resolution and low throughput. As such, photolithography is still the ideal technique for patterning of organic light-emitting materials, since it has good resolution, high-throughput, easy scalability to large substrates, good registration between multiple layers and is very well established in the semiconductor industry. However, the standard organic and polar solvents used in the processing of photosensitive materials can damage the organic light-emitting materials used as active layers. Several approaches have been proposed to overcome this problem. For example, light-emitting polymers with side-groups can be cross-linked under light activation to produce insoluble polymer networks in desired areas. Inserting a photocurable interlayer between the active layer and the substrate and simultaneously patterning both layers can be an alternative less damaging approach. Depositing a buffer layer (parylene-C and CYTOP, respectively) underneath the photoresist film was an effective way to protect the underlying active organic films during the photolithographic processing steps. Also, fluorinated imaging material can be used in combination with fluorous solvents to pattern a wide variety of non-fluorinated organic electronic materials, including poly(9,9-dioctylfluorene) (F8) and poly (3-hexylthiophene) (P3HT) without causing device damage. Another alternative approach to pattern polymer light-emitting diodes (PLEDs) uses dry photolithography (DPP) via a supercritical $CO_2$ process.

The cross-linkable light-emitting polymers mentioned above also provide an approach to achieve solution-processed multi-layer OLED structures. Nevertheless, this option involves complicated chemical synthesis and requires careful polymer handling to prevent undesired cross-linking of the polymer. Moreover, curing agents are unnecessary components for device operation and even generate a significant amount of chemical residue that remains a challenge to device lifetime. Materials orthogonality has been utilized to form three-layer solution-processed light-emitting devices by alternate deposition of hydrophobic polymer and hydrophilic polyelectrolyte solutions. However, the significant amount of mobile ions carried by the polyelectrolytes is known to limit the operating lifetime. In addition, the polar solvents used for dissolving electrolytes, usually water or alcohols that are known to be detrimental to device carrier mobility and lifetime, thus they should be avoided during device processing.

Based on the foregoing, there exists an ongoing and unmet need for methods and materials for patterning of organic materials.

BRIEF SUMMARY OF THE INVENTION

In one aspect, the present invention provides a method for obtaining a patterned structure comprising a fluorine-containing polymeric material comprising the steps of: a) coating a substrate with a layer of fluorine-containing polymeric material; b) coating the substrate from a) with a layer of photoresist material; c) selectively exposing portions of the layer of photoresist material to radiation forming a first pattern of exposed photoresist material and a second pattern of unexposed photoresist material; d) selectively removing either the first pattern of exposed photoresist material or the second pattern of unexposed photoresist material resulting in a residual pattern in the photoresist layer; and e) transferring the residual pattern of the photoresist layer from step d) to the layer of fluorine-containing polymeric material. The method is performed such that a patterned structure comprising a fluorine-containing polymeric material is formed.

In another aspect, the present invention provides a method for obtaining a patterned structure comprising a fluorine-containing polymeric material comprising the steps of: a) coating a substrate with a layer of photoresist material; b)

selectively exposing portions of the layer of photoresist material to radiation forming a first pattern of exposed photoresist material and a second pattern of unexposed photoresist material; c) selectively removing either the first pattern of exposed photoresist material or the second pattern of unexposed photoresist material resulting in a residual pattern in the photoresist layer; d) coating the substrate from c) with a layer of fluorine-containing polymeric material; and e) removing the residual pattern of photoresist material and fluorine-containing polymeric material corresponding to the residual pattern of photoresist material leaving a second residual pattern of fluorine-containing polymeric material on the substrate. The method is performed such that a patterned structure comprising a fluorine-containing polymeric material is formed.

In one embodiment, the fluorine-containing polymeric material comprises a fluorine-containing polymer or fluorine-containing copolymer. The fluorine-containing polymer or copolymer is formed at least in part from a fluorine-containing monomer comprising an active-moiety and a fluorine-containing moiety. In one example, all of the fluorine in the fluorine-containing monomer is located in the fluorine-containing moiety. The fluorine-containing moiety is attached to the active moiety by an alkyl spacer moiety. Optionally, the fluorine-containing polymer or fluorine-containing copolymer further comprises a moiety selected from benzotriazole, benzothiadiazole, thiophene-benzothiadiazole-thiophene moiety and combinations thereof.

In another aspect, the present invention provides a patterned structure of fluorine-containing polymeric material. Such materials can be obtained by the methods disclosed herein. In yet another aspect, the present invention provides a device comprising the patterned structure of fluorine-containing polymeric material, such as those obtained by the methods disclosed herein. For example, the device can comprise three patterned fluorine-containing organic structure layers, where one layer is capable of emitting red light, a second layer is capable of emitting green light and a third layer is capable of emitting blue light. In this example, all three individual patterned fluorine-containing organic structure layers can have the same pattern and are stacked such that the resulting composite pattern is the same as any of the individual layer patterns.

DETAILED DESCRIPTION OF THE INVENTION

Figure 1:
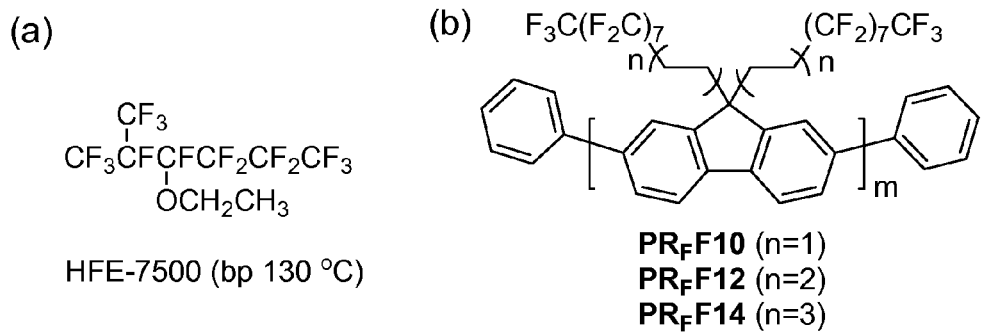
FIG. 1. Chemical structures of (a) HFE-7500, and (b) examples of fluorinated materials (semi-perfluoroalkyl polyfluorenes).

The present invention is directed to methods of patterning of fluorine-containing materials, patterned structures of fluorine-containing materials, the devices comprising patterned structures of fluorine-containing materials. The patterned structures maintain desirable properties (e.g., physical/mechanical properties and/or chemical/electrical/optical properties) on exposure to conventional process materials (e.g., solvents such as non-polar organic solvents, polar organic solvents and aqueous-based solvents used in lithographic patterning processes).

An orthogonal combination of materials, e.g., fluorinated functional polymers with conventional photoresists and solvents, can be used for device patterning. Fluorinated polymer films with sufficient fluorine content remain intact and substantially unaffected when exposed to aqueous-based or organic solvents, even without cross-linking. By substantially unaffected it is meant that the physical and/or mechanical properties and/or chemical and/or electrical and/or optical properties, as appropriate for the specific material, are degraded by 10% or less. In various embodiments, the properties are degraded by 5% or less, 4% or less, 3% or less, 2% or less and 1% or less. Fluorinated light-emitting polymers that are processable in fluorous solvents, such as HFEs, can be patterned using conventional patterning processes based on conventional photoresists and solvents. For example, a blue-emitting polymer, polyfluorene, the F content of which can be controlled by introducing suitable perfluoroalkyl moieties at the 9 position of 9H-fluorene can be patterned according to the present invention. It is expected that this approach can be applied to, for example, other fluorene-containing polymers, including light-emitting polymers and other fluorine-containing polymeric materials.

In an aspect the present invention provides methods of patterning of fluorine-containing materials, such as fluorine-containing polymeric materials. In various embodiments, fluorine-containing materials can be patterned using conventional positive- and/or negative-tone photoresist based processes.

In an embodiment, a method for obtaining a patterned structure comprising a fluorine-containing polymer material comprising the steps of: a) coating a substrate with a layer of fluorine-containing polymeric material; b) coating the substrate from a) with a layer of photoresist material; c) selectively exposing portions of the layer of photoresist material to radiation forming a first pattern of exposed photoresist material and a second pattern of unexposed photoresist material; d) selectively removing either the first pattern of exposed photoresist material or the second pattern of unexposed photoresist material resulting in a residual pattern in the photoresist layer; and e) transferring the residual pattern of the photoresist layer from step d) to the layer of fluorine-containing polymeric material. This process results in formation of a patterned structure of fluorine-containing polymeric material.

Various methods of affecting the transfer of a pattern in photoresist to a layer of fluorine-containing polymeric material are well-known in the art. It is well within the purview of one having skill in the art to choose and optimize, based on the materials being used, the pattern-transfer step. In one embodiment, pattern transfer, e.g., transfer of the residual pattern from step d) as set out above, is carried out by dry etch (e.g., oxygen plasma etch) processing. Optionally, after the pattern-transfer step, any residual photoresist or other residual material can be removed. Methods of removing such materials is well-known in the art.

In another embodiment, a method for obtaining a patterned structure comprising a fluorine-containing polymeric material comprising the steps of: a) coating a substrate with a layer of photoresist material; b) selectively exposing portions of the layer of photoresist material to radiation forming a first pattern of exposed photoresist material and a second pattern of unexposed photoresist material; c) selectively removing either the first pattern of exposed photoresist material or the second pattern of unexposed photoresist material resulting in a residual pattern in the photoresist layer; d) coating the substrate from c) with a layer of fluorine-containing polymeric material; and e) removing the residual pattern of photoresist material and fluorine-containing material corresponding to the residual pattern of photoresist material leaving a second residual pattern of fluorine containing material on the substrate. This process results in formation of a patterned structure of fluorine-containing polymeric material. In various examples, such a process is referred to in the art as a "lift-off" process.

Structures having a feature size (minimum length) of, for example, 50 nm to 500 microns can be formed using the methods disclosed herein. For example, structures formed using methods utilizing photolithographic patterning can have a dimensions resulting from the lithographic patterning process used. Structures with a wide range of thicknesses can be produced using the methods and materials described herein. For example, the thickness of structures can be from 5 nm to 10 microns.

The substrate can have any desired size or thickness. For example, any substrate which can be used in conventional photolithography or other patterning processes can be used. The substrate can be formed from any material so long as the substrate has a surface with properties (e.g., physical properties and chemical properties) such that a layer of fluorine-containing material and/or photoresist can be formed. Also, the substrate can be coated with another material or multiple layers of materials (e.g., a conducting or semi-conducting material). If the substrate is coated with such a material or materials, the outermost layer of the coated substrate must provide a surface with properties (e.g., chemical and physical properties) such that a layer of fluorine-containing material and/or photoresist can be formed. Examples of suitable substrate materials include, but are not limited to, silicon, silicon dioxide, silicon nitride, silicon germanium, glass, polymeric materials (such as organic polymeric materials), and the like. Examples of coated substrates include, but are not limited to, substrates coated with indium tin oxide (ITO).

The processes disclosed herein can use any photoresist material which is compatable with process solvents that do not adversely affect the fluorine-containing polymer materials. An example, such a photoresist is compatible with process solvents that do not detectably effect the desirable physical/mechanical properties and/or chemical/electrical/optical properties of fluorine-containing polymeric materials. Examples of such photoresist materials are well known in the art. Examples of photoresist are well-known in the art and include commercially available materials (e.g., AZ nLOF™ 2020). Both positive-tone and negative-tone photoresists can be used. In some embodiments, it can be desirable that the photoresist not contain fluorine.

In the pattern-development step, the selected portions of the photoresist are removed by contact with an appropriate solvent (e.g., solvents such as non-polar organic solvents, polar organic solvents and aqueous-based solvents). Pattern development in photoresist layers is well-known in the art.

The fluorine-containing polymeric material is any material with sufficient fluorine content such that it can be deposited as a layer on the substrate and patterned according to the methods disclosed herein and the properties (e.g., physical/mechanical and/or chemical/electrical/optical properties) of the material are not degraded such that the material loses its usefulness. For example, the electrical or light-emitting properties are not degraded such that materials are not useful in a device comprising the materials. The fluorine-containing material has 20% or more by weight fluorine content. For example, the fluorine content can be at least 25% or more, 30% or more, 35% or more, 40% or more, 45% or more or 50% or more by weight, including all integers between 20% by weight and 50% by weight.

In one embodiment, the fluorine-containing polymeric material comprises a fluorine-containing polymer or fluorine-containing copolymer. The fluorine-containing polymer or copolymer comprises a fluorine-containing monomer (i.e., the fluorine-containing polymer or copolymer is made by a polymerization reaction the uses, at least in part, a fluorine-containing monomer).

In one example, the fluorine-containing polymer or copolymer is formed at least in part from a fluorine-containing monomer comprising an active-moiety and a fluorine-containing moiety, wherein all of the fluorine in the fluorine-containing monomer is located in the fluorine-containing moiety.

The active moiety comprises a group or groups exhibiting a property or properties such as, for example, light-emitting behavior (e.g., fluorescence or electroluminescence), electron-transport behavior (e.g., electron-transport semiconductors), are useful materials for biological applications and the like. An example of an active moiety is a fluorene group that exhibits light-emitting behavior.

The fluorine-containing moiety comprises a group or groups that contain fluorine such that the desired fluorine content of the polymer is achieved. The fluorine-containing moiety can, for example, comprise a perfluoroalkyl group. The fluorine-containing moiety can be attached to the active moiety by an alkyl spacer moiety that contains, for example, from 1 carbon to 10 carbons, including all integers between 1 carbon and 10 carbons.

As another example, the fluorine-containing polymer or copolymer can also contain benzotriazole moieties, benzothiadiazole moieties, thiophene-benzothiadiazole-thiophene moieties and combinations thereof. These moieties can, optionally, be fluorinated, for example, in a similar manner as disclosed herein.

In various examples, the fluorine-containing polymer or fluorine-containing copolymer comprises a moiety selected from the following structures:

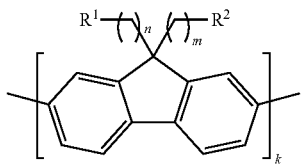

In these structures, $R^1$ and $R^2$ are each independently a fluorine-containing moiety (e.g., a perfluoroalkyl moiety) having from 1 carbon to 12 carbons, including all values between 1 carbon and 12 carbons. The values of n and m are each independently from 1 to 10, including all integers between 1 and 10. The value of k is from 2 to 1,000, including all integers between 2 and 1,000.

In various other examples, the fluorine-containing material is a copolymer having the following structure:

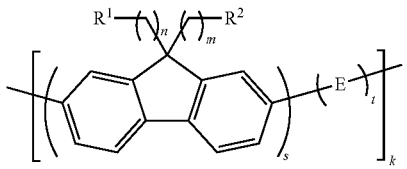

where E is a group comprising moieties such as, for example, benzotriazole moieties, benzothiadiazole moieties, thiophene-benzothiadiazole-thiophene moieties and combinations thereof. The E group can, optionally, be fluorinated, for example, in a similar manner as disclosed herein.

As an example, the fluorine-containing copolymer can have the following structure:

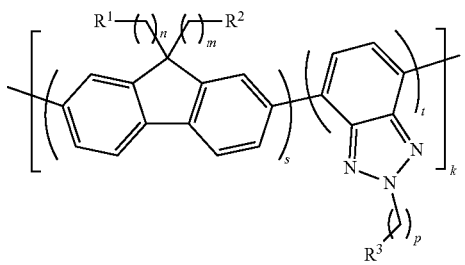

In all of these copolymer structures, $R^1$, $R^2$ and $R^3$ is each independently a fluorine-containing moiety (e.g., a perfluoroalkyl moiety) comprising from 1 carbon to 12 carbons, including all integers between 1 carbon and 12 carbons. The values of wherein n, m and p are each independently from 1 to 10, including all values between 1 and 10. The values of s and t are independently from 1 to 20, including all values between 1 and 20. The value of k is from 2 to 1,000.

The fluorine-containing polymers and fluorine-containing polymers copolymers of the present invention have terminal groups (also referred to as, end groups). Terminal groups and methods of introducing such groups are well-known in the art. For example, the fluorine-containing polymers and fluorine-containing polymers copolymers have end groups such as hydrogen, alkyl groups, phenyl groups, and the like.

In one embodiment, the present invention provides a patterned structure of fluorine-containing polymer material. For example, a patterned structure of fluorine-containing polymer material can be a patterned fluorine-containing organic structure comprising a fluorine-containing polymer or copolymer described herein.

In one embodiment of the methods described herein, the steps of the method are repeated such that multiple layers of patterned structures comprising fluorine-containing polymer materials are obtained. It is desirable that the layers of patterned structures are formed with layer-to-layer registration alignment sufficient to achieve the desired device performance and/or properties. Each of the individual layers of patterned structures can comprise the same or different fluorine-containing polymer materials. An example of such a multi-layer structure is described in Example 2.

In another aspect the present invention provides devices comprising patterned structures of fluorine-containing materials. Examples of such devices include, but are not limited to, devices with displays (for example, organic (e.g., polymer) light emitting diode based displays, particularly full color displays), devices for solid-state lighting applications, sensors and the like. In one embodiment, the present invention provides a device comprising a patterned fluorine-containing organic structure layer produced by the methods disclosed herein.

In one embodiment, the device comprises three patterned fluorine-containing organic structure layers, wherein a first layer is capable of emitting red light, wherein a second layer is capable of emitting green light, and a third layer is capable of emitting blue light.

In another embodiment, all three individual patterned fluorine-containing organic structure layers have the same pattern and are stacked such that the resulting composite pattern is the same as any of the individual layer patterns.

In yet another aspect the present invention provides fluorine-containing polymers and fluorine-containing polymers copolymers. In an embodiment, the fluorine-containing polymer has the following structure:

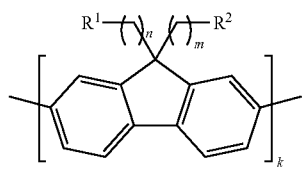

In another embodiment, the fluorine-containing copolymers have the following structure:

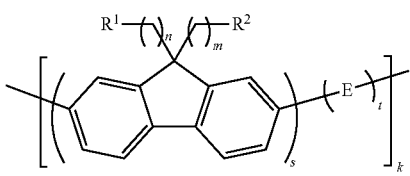

where E is a group such as, for example, benzotriazole moieties, benzothiadiazole moieties, thiophene-benzothiadiazole-thiophene moieties and combinations thereof. The E group can, optionally, be fluorinated.

As an example, the fluorine-containing copolymers have the following structure:

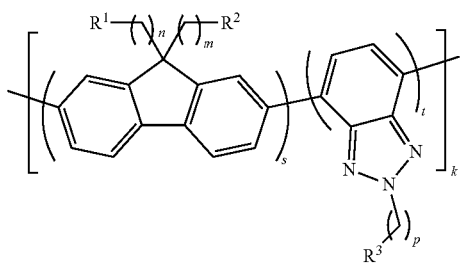

In these copolymer embodiments, $R^1$ and $R^2$ are each independently a fluorine-containing moiety (e.g., a perfluoroalkyl moiety) comprising from 1 carbon to 12 carbons, including all integers between 1 carbon and 10 carbons. The values of n, m and p are each independently from 1 to 10, including all values between 1 and 10. The values of s and t are independently from 1 to 20, including all values between 1 and 20. The value of k is from 2 to 1,000.

The following examples are presented to illustrate the present invention. They are not intended to limiting in any manner.

EXAMPLE 1

In the following, we report the synthesis and processing of semi-perfluoroalkyl polyfluorenes depicted in FIG. 1b, and characterization of their electro-optical properties. Finally, a proof of concept of successful orthogonal patterning of the fluorinated polymers under conventional photolithographic conditions is described.

Perfluoroalkyl moieties are strongly electron-withdrawing, which can perturb the electronic characteristics of polyfluorenes. It is, therefore, desirable to insert suitable alkyl spacers between the polymer backbone and perfluoroalkyl moieties. In the case of monomer synthesis, the alkyl spacers give the added benefit of enabling base-assisted $S_N2$ reactions between semi-perfluoroalkyl halides $[X—(CH_2)_y(CF_2)_zF]$ and 9H-fluorene. Three polymers containing two, four and six $CH_2$ spacers were synthesized ($PR_FF10$, $PR_FF12$ and $PR_FF14$, respectively), as the shielding effect of each spacer has not yet been investigated in the polyfluorene system. The polymer, $PR_FF12$, has 58% F content by weight, which is sufficiently high to make the polymer soluble in HFE-7500 (FIG. 1a) for processing.

Figure 2:
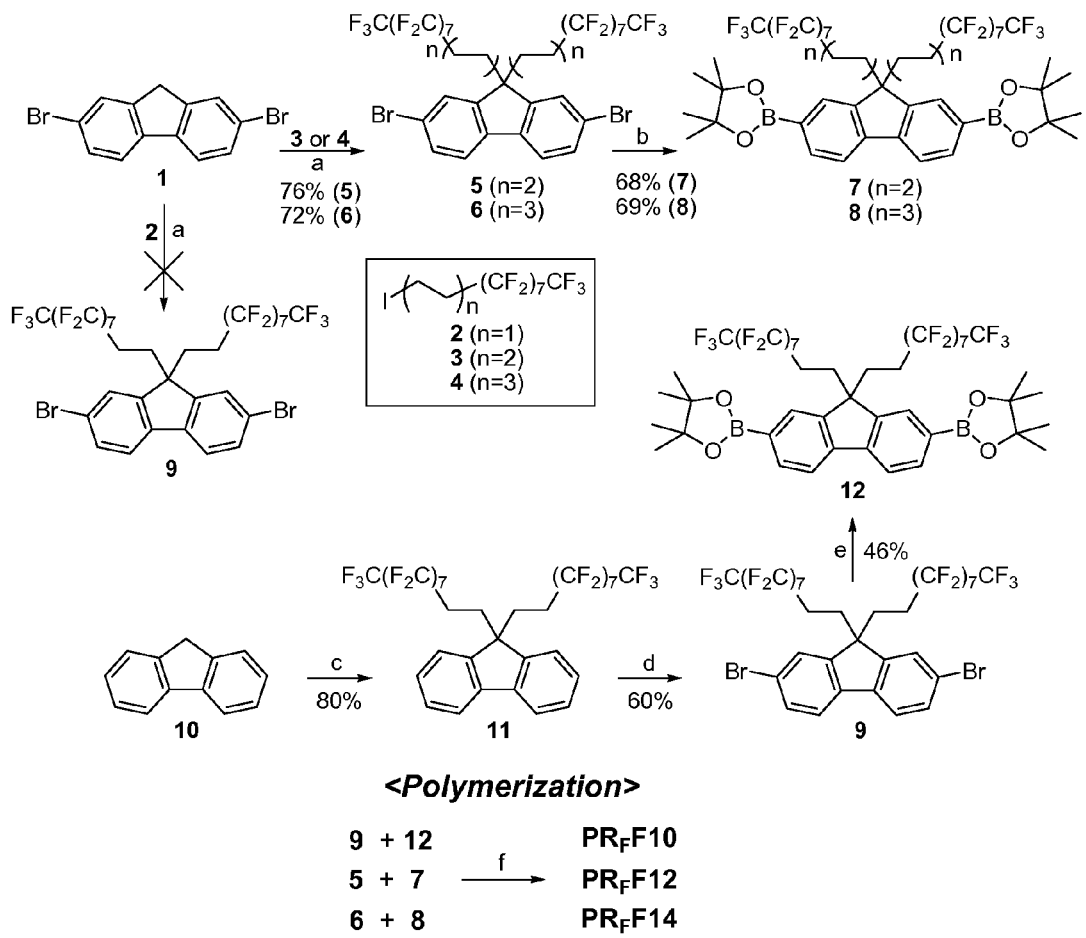
FIG. 2. Synthesis scheme for examples of monomers and polymers. Reagents and conditions: (a) NaOH, Bu$_4$NBr, toluene+water, 80° C., overnight; (b) tBuLi, 2-isopropoxy-4,4,5,5-tetramethyl[1,3,2]dioxaborolane, THF, −78° C.→room temperature, 1.5 hours; (c) "BuLi, 2 (1 eq.), THF, −78° C.→room temperature, 1 hour, this sequence repeated once more; (d) Br$_2$ with cat. I$_2$, CHCl$_3$, 60° C., overnight; (e) bis(pinacolato)diboron, Pd(dppf)Cl$_2$, KOAc, DMF, 80° C., 2 hours; (f) Pd(PPh$_3$)$_4$, Et$_4$NOH, benzotrifluoride+water, 90° C., 2 hours, end-capping with PhB(OH)$_2$ and PhBr.

The Suzuki cross-coupling reaction is a polymerization protocol for high molecular-weight polyfluorenes. It was chosen for synthesis of the target polymers, making it necessary to prepare semi-perfluoroalkyl fluorene dibromides 5, 6 and 9 and diboronates 7, 8 and 12 (FIG. 2). Syntheses of dibromides 5 and 6 were performed conveniently through alkylation reactions of 2,7-dibromofluorene 1 with semifluorinated iodides 3 and 4 respectively under phase-transfer catalysis conditions. Each monomer was recovered in high yield after chromatographic separation and following double recrystallizations. However, the same sequence did not work for the dibromide 9. 2,7-Dibromofluorene-9-one was recovered with a large amount of tarry material. It is postulated that the semifluorinated iodide 2 undergoes an elimination reaction at elevated temperatures to the corresponding vinyl compound, which results in the tarry material. The synthetic pathway was thus modified to permit low temperature synthesis using $^nBuLi$ as a base. Repeated mono-deprotonation and alkylation reactions of 9H-fluorene 10 produced the dialkylated compound 11 in 80% yield. Following bromination at 60° C. led to acquisition of the desired dibromide 9 successfully.

The next step required the preparation of diboronates. The fluorene dibromides 5 and 6 were transformed into the diboronates 7 and 8 in good yield through a series of lithiation reactions using $^tBuLi$ and substitution with isopropoxydioxaborolane. However, the same set of reactions did not prove effective in converting the dibromide 9 into the diboronate 12. Only a large amount of the starting material 9 was recovered at the end of crystallization from acetone. An alternative method employing bis(pinacolato)diboron and Pd catalyst was then applied. The reaction in DMF at 80° C. proved successful, giving the fluorene diboronate 12 in 46% yield after purification.

With all the relevant monomers in hand, Suzuki polycondensation reactions (FIG. 2) were attempted in toluene, employing parameters optimized for ordinary dialkyl polyfluorenes. The immediate problem was the early stage precipitation of high F content polymers. Furthermore, the recovered solids were not appreciably soluble in common organic solvents. This limited capability of non-fluorinated solvents made it necessary to adopt fluorinated liquids, in particular, fluorinated aromatic solvents. Benzotrifluoride was identified as a suitable alternative to toluene, which finally enabled the successful syntheses of high molecular weight $PR_FF10$, $PR_FF12$ and $PR_FF14$ (Table 1). It is worth noting that the catalyst system based on $Pd(PPh_3)_4$ worked equally well in benzotrifluoride without a fluorinated phosphine ligand.

TABLE 1

Physical and optical properties of semi-perfluoroalkyl polyfluorenes.

| Polymer | $M_n$ ($M_w/M_n$) (g mol$^{-1}$)[b] | $T_{decomp.}$ (°C.)[c] | Abs$_{max}$ (nm)[d] | $E_{gap}$ (eV)[e] | PL/EL$_{max}$ (nm)[f] |
|---|---|---|---|---|---|
| PR$_F$F10 | 25,000 (2.0) | 452 | 380 | 3.27 | 418[g] |
| PR$_F$F12 | 29,000 (1.8) | 433 | 391 | 3.18 | 422 |
| PR$_F$F14 | 21,000 (2.2) | 429 | 395 | 3.15 | 423 |
| PF12[a] | 19,000 (1.7) | 418 | 395 | 3.15 | 435 |

[a]Poly(9,9-didodecylfluorene) (PF12) was prepared as a reference.
[b]GPC using fluorinated solvent (Supporting information).[24]
[c]Onset temperature on TGA thermogram.
[d]UV absorption was measured using polymer thin films.
[e]Energy bandgap was extracted from the 1st absorption maximum of the UV-Vis spectra.
[f]Photoluminescence in thin film state.
[g]PL only.

The polymers were purified through repeated precipitations into MeOH, after which they appeared to have Mn's higher than 20,000 g mol-1 with dispersity ca. 2 (Table 1). For comparison, non-fluorinated poly(9,9-didodecylfluorene) (PF12) was synthesized in toluene, which showed a similar molecular weight to the fluorinated polymers. In thermogravimetric analysis (TGA), the semi-perfluoroalkyl polyfluorenes exhibited higher decomposition temperatures (>400° C.) than the non-fluorinated reference (Table 1). In particular, PR$_F$F10 has the highest thermal stability in comparison to the others with longer alkyl spacers. Differential scanning calorimetry (DSC) did not provide information on glass transition temperatures of the polymers. Only transitions possibly associated with melting could be observed. Solubility tests confirmed that all the semi-perfluoroalkyl polyfluorenes are soluble in HFE-7500, to the extent that spin-coating from solution is suitable for EL device fabrication. In addition, those polymers also appear partly soluble in supercritical carbon dioxide at 50° C., 34 MPa.

Optical properties of the polyfluorenes, including absorption maxima of the UV-V is spectra and photoluminescence are also summarized in Table 1. It is evident that semi-fluorination of the alkyl side chains influences the energy band gap. PRFF12 exhibits a blue shift of 13 nm compared to a non-fluorinated reference polymer PF12. In addition, reducing the length of alkyl spacers from $(CH_2)_6$ to $(CH_2)_2$ results in enlargement of the band gap. It is also interesting that PR$_F$F14 shows the same vertical absorption gap as PF12 but exhibits a larger emission gap.

Figure 3:
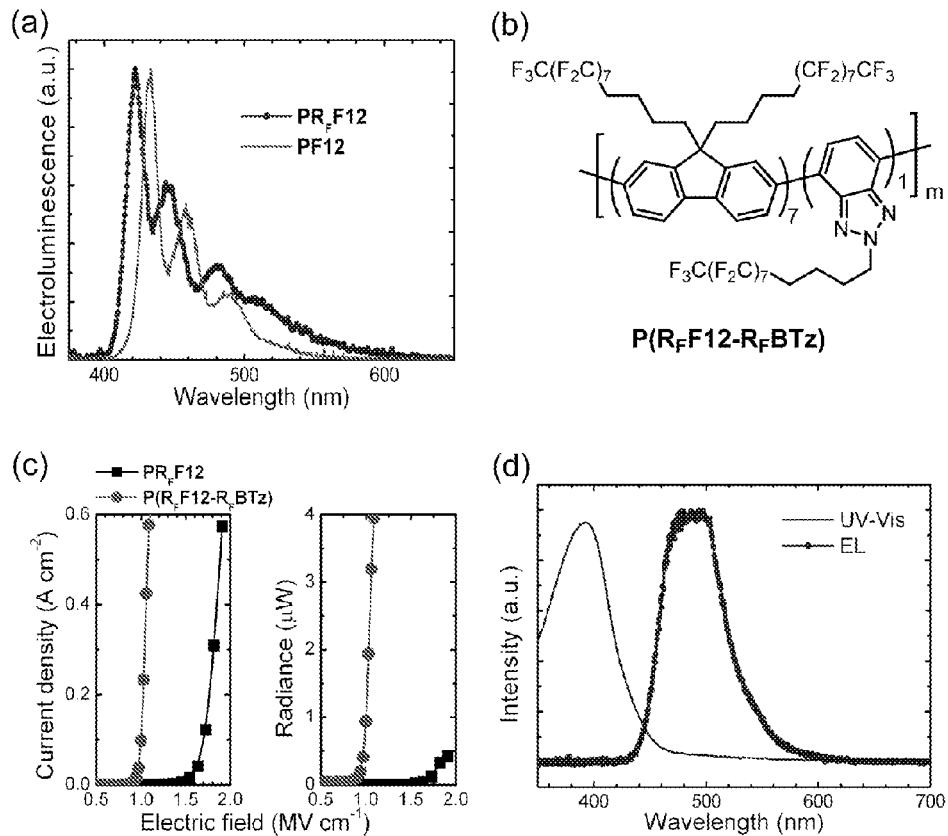
FIG. 3. (a) Example of an EL spectra of PR$_F$F12 and the reference polymer PF12. (b) Example of statistical random copolymer, P(R$_F$F12-R$_F$BTz), composed of semi-perfluoroalkyl fluorene and semi-perfluoroalkyl benzotriazole units. (c) Example of current-voltage-luminance plot of PR$_F$F12 and P(R$_F$F12-R$_F$BTz). (d) Example of UV-Vis absorption and EL spectra of P(R$_F$F12-R$_F$BTz).

Following synthesis, the EL characteristics were studied in a device structure of ITO/PEDOT:PSS/light-emitting polymer/CsF/Al. Films of the fluorinated polymers were deposited from solution in HFE-7500 on a hole injection layer of poly(3,4-ethylenedioxythiophene):poly(styrenesulfonate) (PEDOT:PSS). We observed different EL behavior in the fluorinated polymers compared to their corresponding non-fluorinated polymer PF12. In the case of PR$_F$F10, the emission brightness from the device was below 50 cd m$^{-2}$. With PR$_F$F12 and PR$_F$F14, the devices exhibited similar emission spectra to their PL characteristics (FIG. 3a). However, the devices operated at higher voltages (>10 V) than that of PF12 and their lifetime was short.

To attempt to understand this result, the electronic properties of the polymers and the effect of the semi-perfluoroalkyl side chains were examined. As suggested by calculations employing single fluorene units, the addition of electron-withdrawing semi-perfluoroalkyl chains to a polyfluorene backbone induces a down-shift of HOMO and LUMO. Reducing the length of $CH_2$ spacers further lowers the energy level. The decreased HOMO energy level could therefore result in a larger hole injection barrier at the interface of PEDOT:PSS and semi-perfluoroalkyl polyfluorenes. Another possibility is that the conjugated backbone of the semi-perfluoroalkyl polymers becomes highly electron-deficient, which leads to electron transport problems within the polymer film. This point was demonstrated with a statistical random copolymer P(RF$_F$12-RFBTz) (Mn=26000, Mw/Mn=2.1) retaining a small number of electron-accepting benzotriazole moieties (FIG. 2b). A device made of P(RF$_F$12-RFBTz) turned on at 5 V and reached 100 cd m-2 at 8 V (FIG. 3c), with a sky-blue emission spectrum (ELmax=ca. 490 nm, FIG. 3d). Device parameters and polymer structures can be further optimized for full color configuration.

Figure 4:
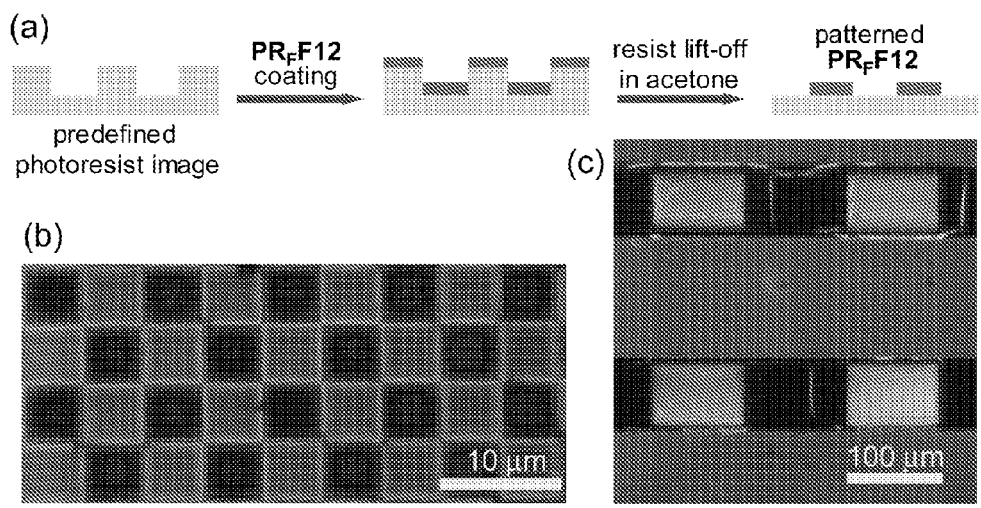
FIG. 4. (a) Example of scheme of patterning using PR$_F$F12 and a conventional photoresist. (b) Example of photoluminescence image of patterned PR$_F$F12 under fluorescence microscope. (c) Example of operating EL pixels constructed using P(RF$_F$12-R$_F$BTz).
Figure 5:
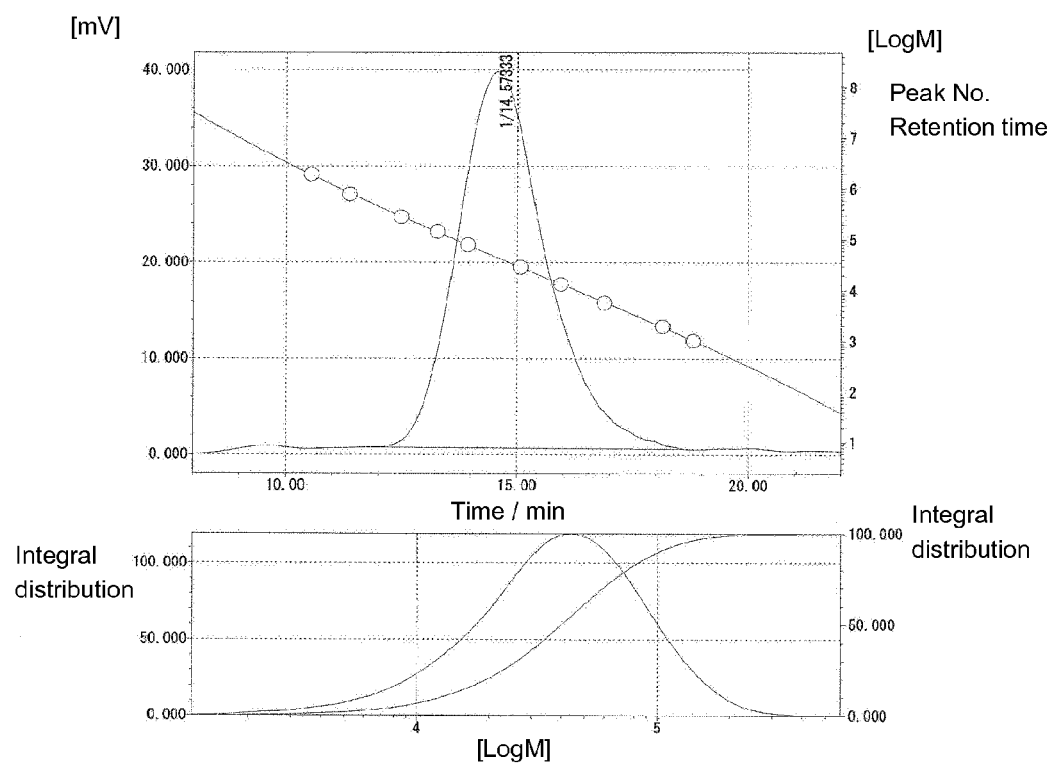
FIG. 5. Example of size exclusion chromatogram of PR$_F$F10.
Figure 6:
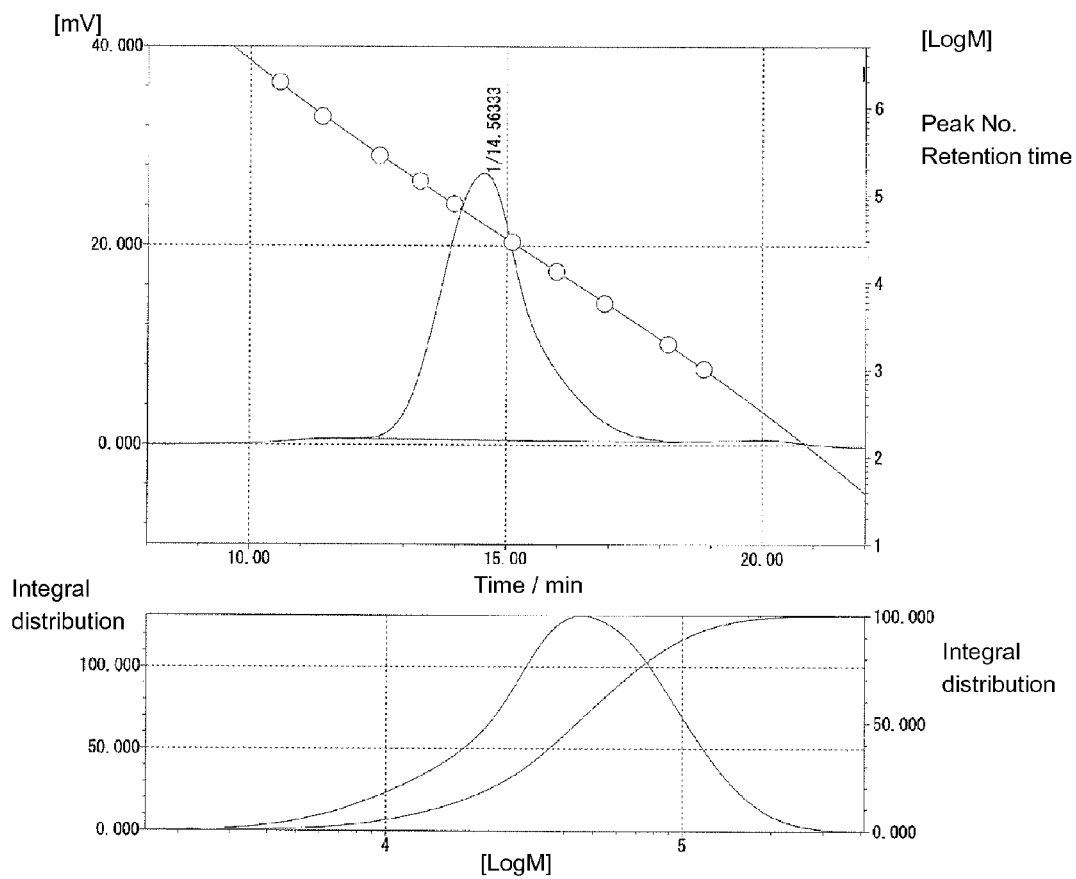
FIG. 6. Example of size exclusion chromatogram of PR$_F$F12.
Figure 7:
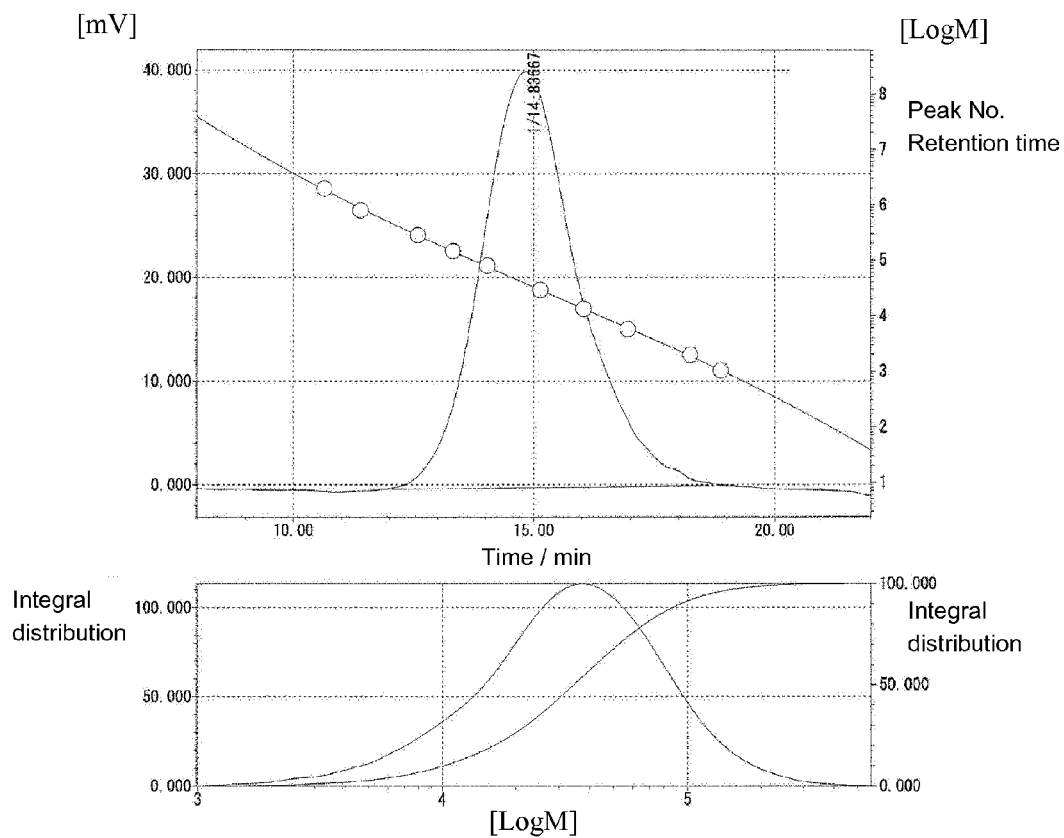
FIG. 7. Size exclusion chromatogram of PR$_F$F14.
Figure 8:
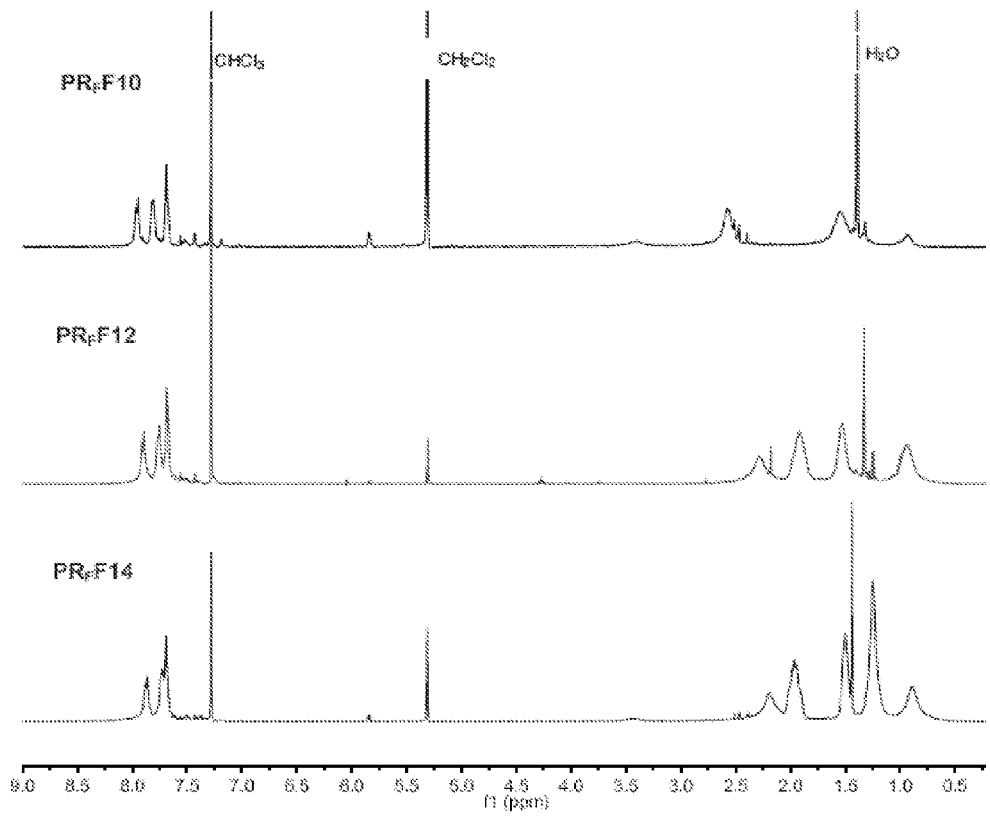
FIG. 8. Example of $^1$H NMR spectrum of PR$_F$F10 and PR$_F$F12.
Figure 9:
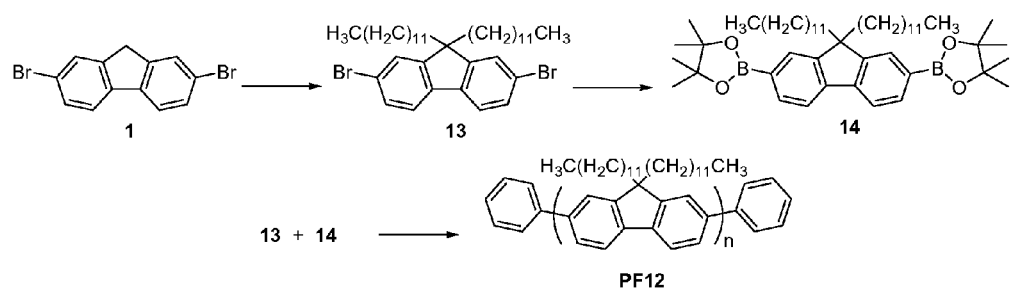
FIG. 9. Example of synthesis of dialkyl polyfluorene PF12.
Figure 10:
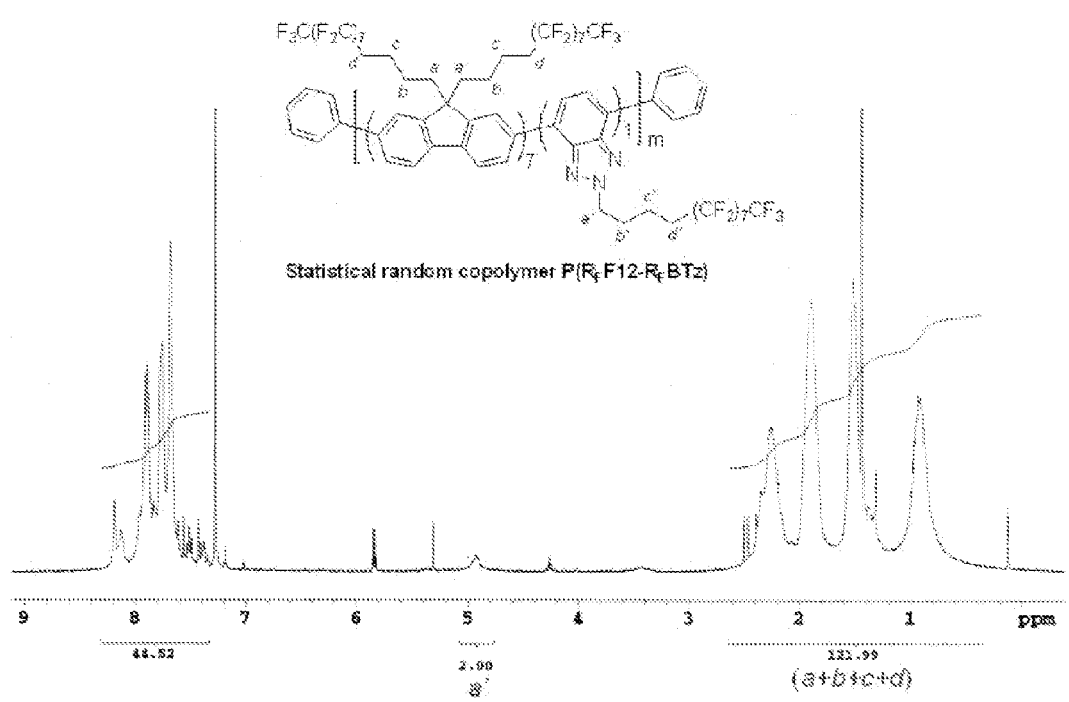
FIG. 10. Example of $^1$H NMR (400 MHz) spectrum of P(R$_F$F12-R$_F$BTz) in a mixed solvent of CDCl$_3$ (1 part by vol.) and CFCl$_3$ (1 part by vol.).

Finally, we demonstrate that the highly fluorinated polymers are patternable under conventional photolithographic conditions. A simplified process scheme is depicted in FIG. 4a. A commercial photoresist was first patterned lithographically on a Si wafer to make a template, onto which a solution of PRFF12 in HFE-7500 was spin-coated. The patterned photoresist film was treated with trichloro(1H,1H,2H,2H-perfluorooctyl)silane vapor prior to the deposition of PR$_F$F12. Lift-off of the photoresist film in acetone produced a well-defined image of PR$_F$F12 down to 5 μm resolution (FIG. 4b). It should be noted that exposure to HFE-7500 and acetone had no adverse effect on the non-fluorinated photoresist image and the deposited PR$_F$F12 film, respectively.

Following this successful step we produced a patterned EL device employing P(RFF12-RFBTz). The fabrication process was essentially the same as FIG. 4a except that a PEDOT:PSS film was spin-coated before the deposition of a P(RFF12-RFBTz) layer and a CsF/Al cathode was vacuum-deposited before the lift-off of the photoresist film in 1-methyl-2-pyrrolidinone. The resulting device operated to give light emission in a 100 μm scale patterned array (FIG. 4c).

In summary, semi-perfluoroalkyl polyfluorenes were synthesized by Suzuki polycondensation reactions. Their optical and EL properties were evaluated, exhibiting distinctive characteristics from their non-fluorinated analogs. Desirable performance and processability of P(RFF12-RFBTz) in fluorinated solvents enabled the fabrication of a patterned EL device by conventional photolithographic methods. The concept of orthogonality between fluorinated electronic polymers and non-fluorinated imaging materials is a strategy to construct multi-layered, full color displays in a more efficient way.

Raw materials and solvents. 2,7-Dibromofluorene, bis(pinacolato)diboron, 2-isopropoxy-4,4,5,5-tetramethyl[1,3,2] dioxaborolane, Et$_4$NOH (20% w/w solution in water), phenylboronic acid, bromobenzene, 1-iodododecane were purchased from Sigma-Aldrich and used as received. Pd(PPh$_3$)$_4$ was purchased from Strem and used without further purification. Anhydrous diethyl ether, benzotrifluoride and THF were purchased from Sigma-Aldrich and used without further drying. 3M™ Novec™ Engineered Fluid HFE-7500 was donated from 3M USA. PEDOT:PSS (Baytron P CH8000 or AI4083) was purchased from H. C. Stark.

Equipment. 1H NMR spectra were recorded on a Varian Inova-400 (400 MHz) or Inova-500 (500 MHz) spectrometer at ambient temperature, using the chemical shift of a residual protic solvent (CHCl$_3$ at δ 7.28 ppm) as an internal reference. All chemical shifts are quoted in parts per million (ppm) relative to the internal reference and coupling constants J are measured in Hz. The multiplicity of the signal is indicated as follows: s (singlet), d (doublet), t (triplet), q (quartet), m (multiplet), dd (doublet of doublets), dt (doublet of triplets), dm (doublet of multiplets), br s (broad singlet) and br d (broad doublet). $^{13}$C NMR spectra were recorded on a Varian Ionova- 400 (100 MHz) or Inova-500 (125 MHz) spectrometer using the central resonance of the triplet of $CDCl_3$ at $\epsilon$ 77.0 ppm. Infrared absorptions were measured for samples in KBr pellet with a Mattson Instruments Galaxy 2020 spectrophotometer. Microanalyses were carried out by Quantitative Technologies, Inc (www.qtionline.com). Mass spectrometry was performed by the department of molecular biology and genetics, Cornell University. Thermo gravimetric analysis (TGA) was performed on a TA Instruments Q500 at a heating rate of 10° C. $min^{-1}$ under $N_2$. The thermal transition behavior of polymers was measured on a TA Instruments Q1000 modulated differential scanning calorimeter (DSC) at a heat/cool rate of 10° C. $min^{-1}$ under $N_2$ for three heat/cool cycles. Size exclusion chromatography was performed on a Waters GPC system (Waters 486 UV detector) by eluting THF (1 $cm^3$ $min^{-1}$) at 40° C., or by Asahi Glass Co. Ltd. (Japan) using dichloropentafluoropropanes as an eluant according to a published procedure. UV-V is absorption spectra were recorded on a Shimadzu UV-3101PC (source change at 320 nm and interval 1 nm). Photoluminescence and electroluminescence spectra were recorded on an Oceanoptics spectrophotometer.

Synthesis of Materials. Semi-Perfluoroalkyl Fluorene Monomers. 2,7-Dibromo-9,9-bis(5,5,6,6,7,7,8,8,9,9,10,10,11,11,12,12,12-heptadecafluorododecyl)-9H-fluorene 5

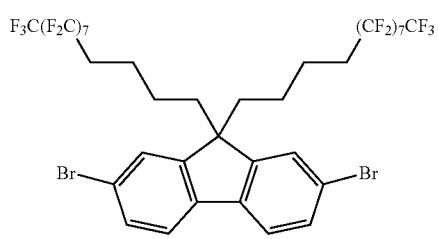

To a magnetically stirred solution of 2,7-dibromofluorene 1 (2.00 g, 6.17 mmol) and 1,1,1,2,2,3,3,4,4,5,5,6,6,7,7,8,8-heptadecafluoro-12-iodododecane 3 (9.29 g, 15.4 mmol) in toluene (12 $cm^3$) were added 50% (w/w) NaOH aqueous solution (24 g) and $Bu_4NBr$ (0.20 g, 0.62 mmol). The mixture was then heated to 80° C. After the reaction was stirred overnight under $N_2$ atmosphere, it was allowed to cool to ambient temperature and quenched by the addition of water (150 $cm^3$). The product was extracted with hexanes (150 $cm^3$). The organic layer was then washed with water (150 $cm^3$), dried over anhydrous $MgSO_4$ and concentrated under reduced pressure. The crude product was purified by flash column chromatography (silica gel, hexanes) and then recrystallized from $CH_2Cl_2$ (40 $cm^3$) twice to give the dibromofluorene 5 as colorless crystals (5.93 g, 76%); mp 96-98° C. ($CH_2Cl_2$); (Found: C, 34.7; H, 1.6. $C_{37}H_{22}Br_2F_{34}$ requires C, 34.9; H, 1.7%); IR (KBr) $v_{max}$: 3074, 2943, 2905, 2872, 2846, 1598, 1448, 1372, 1332, 1244, 1206, 1151, 1042, 956, 873, 811, 742, 707 $cm^{-1}$; $^1H$ NMR (500 MHz, $CDCl_3$, $\delta$) 7.56 (d, J=8 Hz, 2H, Ar—H), 7.51 (dd, J=1.5, 8 Hz, 2H, Ar—H), 7.47 (d, J=1.5 Hz, 2H, Ar—H), 2.08-1.98 (m, 4H, 2×ArCCH$_2$), 1.90-1.76 (m, 4H, 2×CH$_2$CF$_2$), 1.41 (dt, J=8, 16 Hz, 4H, 2×CH$_2$CH$_2$CF$_2$), 0.74-0.61 ppm (m, 4H, 2×CH$_2$CH$_2$CH$_2$CF$_2$); $^{13}C$ NMR (126 MHz, $CDCl_3$, $\delta$) 151.3, 139.1, 130.7, 126.0, 121.9, 121.4, 55.2, 39.9, 30.6 (t, J=22 Hz), 23.2, 20.2 ppm; m/z (ESI) 1272.0 [M$^+$. $C_{37}H_{22}Br_2F_{34}$: requires M, 1271.95].

2,7-Bis(4,4,5,5-tetramethyl[1,3,2]dioxaborolan-2-yl)-9,9-bis(5,5,6,6,7,7,8,8,9,9,10,10,11,11,12,12,12-heptadecafluorododecyl)-9H-fluorene 7

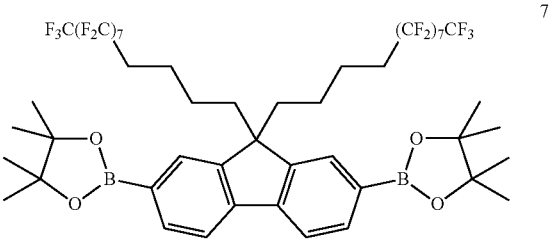

To a magnetically stirred solution of dibromofluorene 5 (2.00 g, 1.57 mmol) in anhydrous THF (20 $cm^3$) was added $^t$BuLi (1.7 M solution in pentane, 4.16 $cm^3$, 7.07 mmol) drop-wise at −78° C. under $N_2$ atmosphere. After the solution was stirred for 10 minutes at −78° C., it was allowed to warm to 0° C. and cooled back to −78° C. 2-Isopropoxy-4,4,5,5-tetramethyl[1,3,2]dioxaborolane (0.731 g, 3.93 mmol) was then added drop-wise to the mixture. After the reaction was stirred for 10 minutes −78° C., it was allowed to warm to ambient temperature and stirred for 1.5 hours. The reaction was then quenched by the addition of water (40 $cm^3$). The product was extracted with $Et_2O$ (40 $cm^3$). The organic layer was washed with brine (40 $cm^3$), dried over anhydrous $MgSO_4$ and concentrated under reduced pressure. The crude product was purified by crystallization from acetone (15 $cm^3$) twice to give the fluorene diboronester 7 as colorless crystals (1.47 g, 68%); mp 124-125° C. (acetone); (Found: C, 43.1; H, 3.25. $C_{49}H_{46}B_2F_{34}O_4$ requires C, 43.1; H, 3.4%); IR (KBr) $v_{max}$: 2983, 2945, 1608, 1477, 1427, 1354, 1244, 1211, 1149, 1116, 1080, 1040, 966, 854, 830, 705 $cm^{-1}$; $^1H$ NMR (500 MHz, $CDCl_3$, $\delta$) 7.86 (d, J=8 Hz, 2H, Ar—H), 7.76 (d, J=8.0, 4H, Ar—H), 2.14-2.05 (m, 4H, 2×ArCCH$_2$), 1.85-1.69 (m, 4H, 2×CH$_2$CF$_2$), 1.41 (s, 24H, 8×CH$_3$), 1.39-1.30 (m, 4H, 2×CH$_2$CH$_2$CF$_2$), 0.67-0.55 ppm (m, 4H, 2×CH$_2$CH$_2$CH$_2$CF$_2$); $^{13}C$ NMR (126 MHz, $CDCl_3$, $\delta$) 149.2, 143.9, 134.1, 128.6, 119.6, 83.9, 54.8, 39.7, 30.6 (t, J=22 Hz), 24.9, 23.2, 20.2 ppm; m/z (ESI) 1367.4 [(M+H)$^+$. $C_{49}H_{47}B_2F_{34}O_4$: requires M, 1367.31].

1,1,1,2,2,3,3,4,4,5,5,6,6,7,7,8,8-Heptadecafluoro-12-iodotetradecane 4

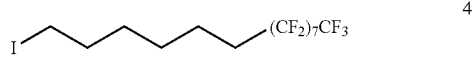

To a magnetically stirred solution of 7,7,8,8,9,9,10,10,11,11,12,12,13,13,14,14,14-heptadecafluorotetradecan-1-ol (12.5 g, 24.0 mmol), triphenylphosphine (9.45 g, 36.0 mmol) and imidazole (2.45 g, 36.0 mmol) in THF (100 $cm^3$) was added $I_2$ (9.15 g, 36.0 mmol) in a dry ice/acetone bath under a $N_2$ atmosphere. The reaction mixture was then allowed to warm up to ambient temperature. After the reaction was stirred for 2 hours, it was quenched by the addition of water (100 cm³) and Et₂O (100 cm³). The organic layer was separated, washed with brine (100 cm³) and concentrated under reduced pressure. When a large amount of triphenylphosphine oxide precipitated, Et₂O (100 cm³) was added to the flask. The precipitated solid was filtered through a short plug of silica gel with flushing with a copious amount of Et₂O. The filtrate was concentrated under reduced pressure and the resulting viscous liquid was crystallized from MeOH (100 cm³) to give the semi-perfluoroalkyl iodide 4 as colorless crystals (12.7 g, 84%); mp 46-47° C. (MeOH); (Found: C, 26.8; H, 1.7. $C_{14}H_{12}F_{17}I$ requires C, 26.7; H, 1.9%); IR (KBr) $v_{max}$: 2946, 2864, 1594, 1332, 1242, 1209, 1151, 1059, 1023, 952, 705 cm⁻¹; ¹H NMR (500 MHz, CDCl₃, δ) 3.22 (t, J=7 Hz, 2H, CH₂I), 2.14-2.03 (m, 2H, CF₂CH₂), 1.89-1.83 (m, 2H, CH₂CH₂I), 1.67-1.61 (m, 2H, CF₂CH₂CH₂), 1.51-1.40 ppm (m, 4H, CH₂CH₂CH₂CH₂I); ¹³C NMR (126 MHz, CDCl₃, δ) 33.1, 30.8 (t, J=22 Hz), 30.1, 28.0, 20.0, 6.66 ppm; m/z (ESI) 652.9 [(M+Na)⁺. $C_{14}H_{12}F_{17}INa$: requires M, 652.96].

2,7-Dibromo-9,9-bis(7,7,8,8,9,9,10,10,11,11,12,12,13,13,14,14,14-heptadecafluorotetradecyl)-9H-fluorene 6

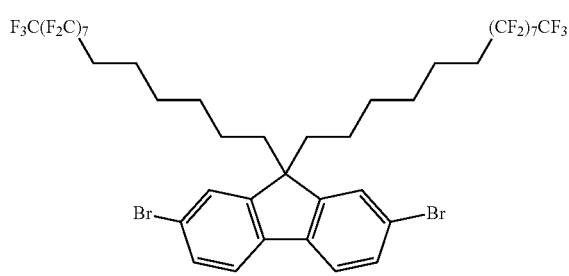

To a magnetically stirred solution of 2,7-dibromofluorene 1 (2.00 g, 6.17 mmol) and semi-perfluoroalkyl iodide 4 (9.72 g, 15.4 mmol) in toluene (12 cm³) were added 50% (w/w) NaOH aqueous solution (24 g) and Bu₄NBr (0.20 g, 0.62 mmol). The mixture was then heated to 80° C. After the reaction was stirred overnight under N₂ atmosphere, it was allowed to cool to ambient temperature and quenched by the addition of water (150 cm³). The product was extracted with hexanes (150 cm³). The organic layer was then washed with water (150 cm³), dried over anhydrous MgSO₄ and concentrated under reduced pressure. The crude product was purified by flash column chromatography (silica gel, hexanes) and then recrystallized from hexanes (40 cm³) twice to give the dibromofluorene 6 as colorless crystals (5.91 g, 72%); mp 82-83° C. (hexanes); (Found: C, 37.4; H, 2.1. $C_{41}H_{30}Br_2F_{34}$ requires C, 37.1; H, 2.3%); IR (KBr) $v_{max}$: 2932, 2855, 1600, 1448, 1371, 1329, 1245, 1208, 1150, 1054, 1017, 980, 954, 810, 705 cm⁻¹; ¹H NMR (500 MHz, CDCl₃, δ) 7.55 (d, J=8 Hz, 2H, Ar—H), 7.49 (dd, J=1.5, 8 Hz, 2H, Ar—H), 7.46 (d, J=1.5 Hz, 2H, Ar—H), 2.00-1.90 (m, 8H, 2×ArCCH₂ and 2×CH₂CF₂), 1.47-1.41 (m, 4H, 2×CH₂CH₂CF₂), 1.20-1.09 (m, 8H, 2×ArCCH₂CH₂ and 2×CH₂CH₂CH₂CF₂), 0.65-0.59 ppm (m, 4H, 2×ArCCH₂CH₂); ¹³C NMR (126 MHz, CDCl₃, δ) 152.1, 139.1, 130.3, 126.0, 121.6, 121.2, 55.5, 40.0, 30.7 (t, J=22 Hz), 29.4, 28.7, 23.5, 20.0 ppm; m/z (ESI) 1328.0 [M⁺. $C_4H_{30}Br_2F_{34}$: requires M, 1328.01].

2,7-Bis(4,4,5,5-tetramethyl[1,3,2]dioxaborolan-2-yl)-9,9-bis(7,7,8,8,9,9,10,10,11,11,12,12,13,13,14,14,14-heptadecafluorotetradecyl)-9H-fluorene 8

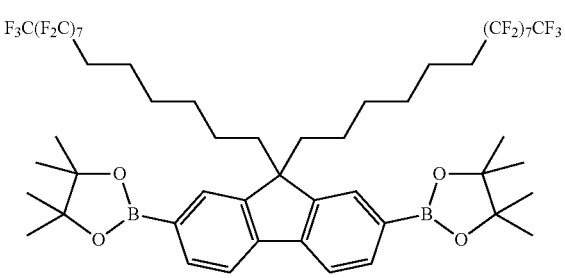

To a magnetically stirred solution of dibromofluorene 6 (3.50 g, 2.63 mmol) in anhydrous THF (30 cm³) was added ᵗBuLi (1.7 M solution in pentane, 7.75 cm³, 13.2 mmol) drop-wise at −78° C. under N₂ atmosphere. After the solution was stirred for 10 minutes at −78° C., it was allowed to warm to 0° C. and cooled back to −78° C. 2-Isopropoxy-4,4,5,5-tetramethyl[1,3,2]dioxaborolane (1.23 g, 6.59 mmol) was then added drop-wise to the mixture. After the reaction was stirred for 10 minutes −78° C., it was allowed to warm to ambient temperature and stirred for 1.5 hours. The reaction was then quenched by the addition of water (100 cm³). The product was extracted with Et₂O (120 cm³). The organic layer was washed with water (100 cm³) and brine (100 cm³), dried over anhydrous MgSO₄ and concentrated under reduced pressure. The crude product was purified by crystallization from acetone (20 cm³) twice to give the fluorene diboronester 8 as colorless crystals (2.59 g, 69%); mp 88-89° C. (acetone); (Found: C, 45.1; H, 3.6. $C_{53}H_{54}B_2F_{34}O_4$ requires C, 44.8; H, 3.8%); IR (KBr) $v_{max}$: 2982, 2934, 2862, 1610, 1478, 1426, 1354, 1241, 1212, 1148, 1081, 966, 860, 827, 705 cm⁻¹; ¹H NMR (500 MHz, CDCl₃, δ) 7.84 (d, J=7.5 Hz, 2H, Ar—H), 7.75 (d, J=7.5, 4H, Ar—H), 2.05-2.02 (m, 4H, 2×ArCCH₂), 1.96-1.86 (m, 4H, 2×CH₂CF₂), 1.40 (s, 28H, 8×CH₃ and 2×CH₂CH₂CF₂), 1.15-1.04 (m, 8H, 2×ArCCH₂CH₂ and 2×CH₂CH₂CH₂CF₂), 0.61-0.55 ppm (m, 4H, 2×ArCCH₂CH₂); ¹³C NMR (126 MHz, CDCl₃, δ) 150.0, 143.9, 133.8, 128.7, 119.5, 83.8, 55.0, 39.9, 30.7 (t, J=22 Hz), 29.4, 28.6, 24.9, 23.4, 19.9 ppm; m/z (ESI) 1423.4 [(M+H)⁺. $C_{53}H_{55}B_2F_{34}O_4$: requires M, 1423.37].

9,9-Bis(3,3,4,4,5,5,6,6,7,7,8,8,9,9,10,10,10-heptadecafluorodecyl)-9H-fluorene 11

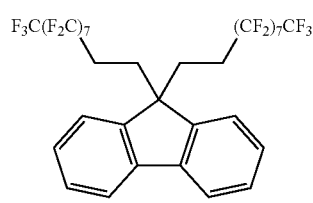

To a magnetically stirred solution of 9H-fluorene 10 (1.50 g, 9.02 mmol) in anhydrous THF (20 cm³) was added ⁿBuLi (1.6 M solution in hexanes, 6.20 cm³, 9.93 mmol) drop-wise at −78° C. under N₂ atmosphere. The solution was then allowed to warm to 0° C. and cooled back to −78° C. A solution of 1,1,1,2,2,3,3,4,4,5,5,6,6,7,7,8,8-heptadecafluoro-10-iododecane 2 (5.18 g, 9.02 mmol) in THF (5 cm$^3$) was added drop-wise to the reaction mixture. The reaction was allowed to warm to ambient temperature, stirred for 1 h and cooled back to −78° C. Another portion of $^n$BuLi (1.6 M solution in hexanes, 6.20 cm$^3$, 9.93 mmol) was then added to the reaction mixture. The solution was allowed to warm to 0° C. and cooled back to −78° C. Another solution of 1,1,1,2,2,3,3,4,4,5,5,6,6,7,7,8,8-heptadecafluoro-10-iododecane 2 (6.22 g, 10.8 mmol) in THF (5 cm$^3$) was added drop-wise to the reaction mixture. The solution was allowed to warm to ambient temperature, stirred for 1 h, and then quenched by the addition of water (150 cm$^3$). The product was extracted with hexanes (150 cm$^3$). The organic layer was washed with water (150 cm$^3$), dried over anhydrous MgSO$_4$, passed through a short plug of silica gel with flushing with a copious volume of hexanes, and concentrated under reduced pressure. The crude product was purified by crystallization from CH$_2$Cl$_2$ (50 cm$^3$) twice to give the fluorene 11 as colorless crystals (7.68 g, 80%); mp 87-88° C. (CH$_2$Cl$_2$); (Found: C, 37.5; H, 1.5. C$_{33}$H$_{16}$F$_{34}$ requires C, 37.45; H, 1.5%); IR (KBr) ν$_{max}$: 3075, 3044, 2945, 1591, 1454, 1373, 1245, 1208, 1152, 1008, 741 cm$^{−1}$; $^1$H NMR (400 MHz, CDCl$_3$, δ): 7.77 (dd, J=1.5, 6.5 Hz, 2H, Ar—H), 7.52-7.32 (m, 6H, Ar—H), 2.46-2.23 (m, 4H, 2×CH$_2$CH$_2$CF$_2$), 1.47-1.03 ppm (m, 4H, 2×CH$_2$CF$_2$); $^{13}$C NMR (101 MHz, CDCl$_3$, δ): 146.1, 141.1, 128.3, 128.2, 122.3, 120.5, 52.7, 30.4, 25.8 ppm (t, J=22 Hz); m/z (ESI) 1057.9 [M$^+$. C$_{33}$H$_{16}$F$_{34}$: requires M, 1058.07].

2,7-Dibromo-9,9-bis(3,3,4,4,5,5,6,6,7,7,8,8,9,9,10,10,10-heptadecafluorodecyl)-9H-fluorene 9

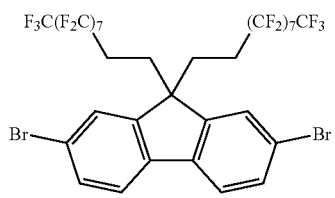

To a magnetically stirred solution of diperfluoroalkyl fluorene 11 (13.3 g, 12.6 mmol) in CHCl$_3$ (70 cm$^3$) was added Br$_2$ (16.1 g, 101 mmol) and a few pieces of I$_2$. The mixture was then heated to 60° C. and stirred overnight. The reaction solution was allowed to cool to ambient temperature, diluted with CH$_2$Cl$_2$ (50 cm$^3$) and left at −20° C. for crystallization. The crude product was recovered by vacuum filtration and dissolved in Et$_2$O (100 cm$^3$). The solution was passed through a short plug of silica gel with flushing with a copious volume of Et$_2$O and concentrated under reduced pressure. The product was further purified by recrystallization from hexanes (100 cm$^3$) twice to give the dibromofluorene 9 as colorless crystals (9.20 g, 60%); mp 130-131° C. (hexanes); (Found: C, 32.9; H, 1.0. C$_{33}$H$_{14}$Br$_2$F$_{34}$ requires C, 32.6; H, 1.2%); IR (KBr) ν$_{max}$: 3080, 2941, 1600, 1455, 1373, 1332, 1208, 1153, 1016, 949, 868, 812, 705 cm$^{−1}$; $^1$H NMR (400 MHz, CDCl$_3$, δ) 7.62 (dd, J=0.5, 8 Hz, 2H, Ar—H), 7.59 (dd, J=1.5, 8 Hz, 2H, Ar—H), 7.52 (dd, J=0.5, 1.5 Hz, 2H, Ar—H), 2.48-2.20 (m, 4H, 2×CH$_2$CH$_2$CF$_2$), 1.45-1.15 ppm (m, 4H, 2×CH$_2$CF$_2$); $^{13}$C NMR (101 MHz, CDCl$_3$, δ) 147.9, 139.0, 132.0, 125.8, 122.7, 121.9, 53.2, 30.3, 25.7 ppm; m/z (ESI) 1215.8 [M$^+$. C$_{33}$H$_{14}$Br$_2$F$_{34}$: requires M, 1215.89].

2,7-Bis(4,4,5,5-tetramethyl[1,3,2]dioxaborolan-2-yl)-9,9-bis(3,3,4,4,5,5,6,6,7,7,8,8,9,9,10,10,10-heptadecafluorodecyl)-9H-fluorene 12

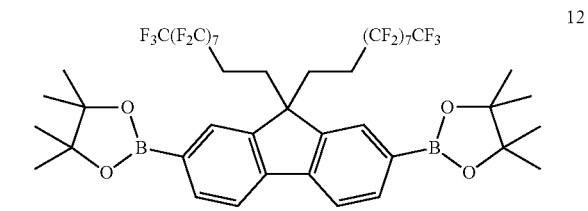

To a magnetically stirred mixture of dibromofluorene 9 (4.00 g, 3.29 mmol), bis(pinacolato)diboron (2.09 g, 8.22 mmol) and KOAc (1.94 g, 19.7 mmol) in anhydrous DMF (N$_2$ bubbled, 24 cm$^3$) was added Pd(dppf)Cl$_2$ (CH$_2$Cl$_2$ complex, 0.134 g, 0.164 mmol) under a N$_2$ atmosphere. The reaction mixture was then heated to 80° C. After the reaction was stirred for 2 hours at 80° C., it was allowed to cool to ambient temperature, and left for an hour to crystallize the product. The crystals were recovered by vacuum filtration and dissolved in Et$_2$O (100 cm$^3$). The organic solution was then passed through a short plug of silica gel with flushing with a copious volume of Et$_2$O and concentrated under reduced pressure. The product was further purified by recrystallization from acetone (20 cm$^3$) twice to give the fluorene diboronester 12 as pale-yellow crystals (2.00 g, 46%); mp 149-150° C. (acetone); (Found: C, 41.3; H, 2.6. C$_{45}$H$_{38}$B$_2$F$_{34}$O$_4$ requires C, 41.3; H, 2.9%); IR (KBr) ν$_{max}$: 2987, 2941, 1610, 1481, 1428, 1356, 1240, 1209, 1149, 1082, 963, 855, 707 cm$^{−1}$; $^1$H NMR (400 MHz, CDCl$_3$, δ) 7.91 (dd, J=1, 7.5 Hz, 2H, Ar—H), 7.79 (d, J=7.8 Hz, 4H, Ar—H), 2.49-2.33 (m, 4H, 2×CH$_2$CH$_2$CF$_2$), 1.41 (s, 24H, 8×CH$_3$), 1.34-1.17 ppm (m, 4H, 2×CH$_2$CF$_2$); $^{13}$C NMR (101 MHz, CDCl$_3$, δ) 146.0, 143.7, 135.2, 128.5, 120.1, 84.0, 52.8, 30.2, 25.8 (t, J=22 Hz), 24.8 ppm; m/z (ESI) 1311.3 [(M+H)$^+$. C$_{45}$H$_{39}$B$_2$F$_{34}$O$_4$: requires M, 1311.25].

Semi-Perfluoroalkyl Polyfluorenes. PR$_F$F10

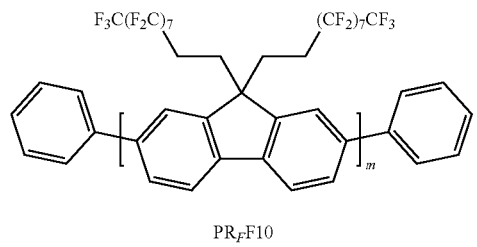

PR$_F$F10

To a Schlenk tube were added dibromofluorene 9 (0.500 g, 0.411 mmol), fluorene diboronester 12 (0.539 g, 0.411 mmol) and Pd(PPh$_3$)$_4$ (0.024 g, 0.021 mmol). The tube was then purged with N$_2$. Benzotrifluoride (N$_2$ bubbled, 7 cm$^3$) was added and the solution was stirred at 90° C. for 5 minutes. Et$_4$NOH aqueous solution (20% w/w, N$_2$ bubbled, 7 cm$^3$) was then added. After the mixture was stirred for 2 hours at 90° C., a solution of phenylboronic acid (0.050 g, 0.41 mmol) in benzotrifluoride (2 cm$^3$) was added. The reaction was stirred for 1 hour. Bromobenzene (0.13 g, 0.82 mmol) was added to the reaction mixture. After the reaction was stirred for further 2 hours, it was allowed to cool to ambient temperature and poured into stirring MeOH (300 cm³). The precipitate was filtered and dissolved in benzotrifluoride again. The solution was passed through a short plug of silica gel with flushing with a copious amount of benzotrifluoride and concentrated under reduced pressure. The resulting polymer was dissolved in benzotrifluoride and precipitated again in stirring MeOH (300 cm³). The filtered polymer was dried under reduced pressure to give the PR$_F$F10 as an off-white fibrous solid (0.50 g); IR (KBr) $v_{max}$: 2961, 1596, 1245, 1210, 1150, 1021, 816, 728, 707 cm$^{-1}$; $^1$H NMR [400 MHz, CDCl$_3$ (1 part by vol.)+CFCl$_3$ (1 part by vol.), δ] 7.96 (br d, J=7.5 Hz, 2H, Ar—H), 7.81 (br d, J=7.5 Hz, 2H, Ar—H), 7.69 (br s, 2H, Ar—H), 2.57 (br s, 4H, 2×CH$_2$CH$_2$CF$_2$), 1.54 ppm (br s, 4H, 2×CH$_2$CF$_2$).

PR$_F$F14

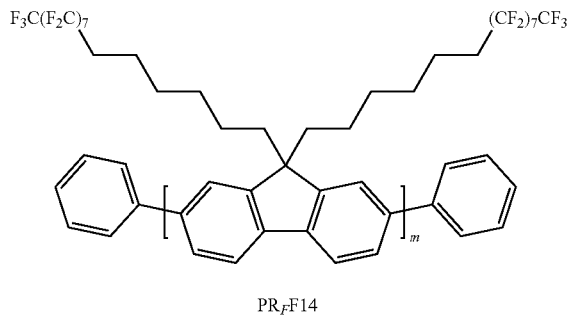

PR$_F$F14

To a Schlenk tube were added dibromofluorene 6 (0.500 g, 0.376 mmol), fluorene diboronester 8 (0.535 g, 0.376 mmol) and Pd(PPh$_3$)$_4$ (0.022 g, 0.019 mmol). The tube was then purged with N$_2$. Benzotrifluoride (N$_2$ bubbled, 6 cm³) was added and the solution was stirred at 90° C. for 5 minutes. Et$_4$NOH aqueous solution (20% w/w, N$_2$ bubbled, 6 cm³) was then added. After the mixture was stirred for 2 hours at 90° C., a solution of phenylboronic acid (0.046 g, 0.38 mmol) in benzotrifluoride (1 cm³) was added. The reaction was stirred for 1 hour. Bromobenzene (0.12 g, 0.75 mmol) was added to the reaction mixture. After the reaction was stirred for further 2 hours, it was allowed to cool to ambient temperature and poured into stirring MeOH (300 cm³). The precipitate was filtered and dissolved in benzotrifluoride again. The solution was passed through a short plug of silica gel with flushing with a copious amount of benzotrifluoride and concentrated under reduced pressure. The resulting polymer was dissolved in benzotrifluoride and precipitated again in stirring MeOH (300 cm³). The filtered polymer was dried under reduced pressure to give PR$_F$F14 as a pale-yellow fibrous solid (0.63 g); IR (KBr) $v_{max}$: 2939, 2863, 1599, 1463, 1243, 1208, 1150, 1050, 816, 726, 705 cm$^{-1}$; $^1$H NMR [400 MHz, CDCl$_3$ (1 part by vol.)+CFCl$_3$ (1 part by vol.), δ] 7.87 (br d, J=7.5 Hz, 2H, Ar—H), 7.73 (br d, J=7.5 Hz, 2H, Ar—H), 7.69 (br s, 2H, Ar—H), 2.19 (br s, 4H, 2×ArCCH$_2$), 2.03-1.90 (br m, 4H, 2×CH$_2$CF$_2$), 1.50 (br s, 4H, 2×CH$_2$CH$_2$CF$_2$), 1.23 (br s, 8H, 2×ArCCH$_2$CH$_2$CH$_2$ and 2×CH$_2$CH$_2$CH$_2$CF$_2$), 0.89 ppm (br s, 4H, 2×ArCCH$_2$CH$_2$).

Non-perfluoroalkyl fluorene monomers and the corresponding polymer (PF12) as a reference material. 2,7-Dibromo-9,9-didodecylfluorene 13. To a magnetically stirred solution of 2,7-dibromofluorene 1 (3.00 g, 9.26 mmol) and 1-iodododecane (6.86 g, 23.1 mmol) in toluene (10 cm³) were added 50% (w/w) NaOH aqueous solution (20 g) and Bu$_4$NBr (0.30 g, 0.93 mmol). The mixture was then heated to 80° C. After the reaction was stirred overnight under N$_2$ atmosphere, it was allowed to cool to ambient temperature and quenched by the addition of water (100 cm³). The product was extracted with hexanes (100 cm³). The organic layer was then washed with water (100 cm³), dried over anhydrous MgSO$_4$ and concentrated under reduced pressure. The crude product was purified by flash column chromatography (silica gel, hexanes) and then recrystallized from a solvent mixture of 2-propanol (30 cm³) and hexanes (30 cm³) twice to give the dibromofluorene 13 as colorless crystals (3.55 g, 58%); mp 49-50° C. (2-propanol/hexanes) [lit.,[4] 45° C. (hexanes)]; $^1$H NMR (500 MHz, CDCl$_3$, δ) 7.53 (d, J=8 Hz, 2H), 7.48-7.45 (m, 4H), 1.97-1.88 (m, 4H), 1.36-1.00 (m, 36H), 0.89 (t, J=7 Hz, 6H), 0.59 (m, 4H). The $^1$H NMR data is in agreement with literature values.

2,7-Bis(4,4,5,5-tetramethyl[1,3,2]dioxaborolan-2-yl)-9,9-didodecylfluorene 14. To a magnetically stirred solution of dibromofluorene 13 (5.00 g, 7.57 mmol) in anhydrous THF (50 cm³) was added $^t$BuLi (1.7 M solution in pentane, 20 cm³, 34.1 mmol) drop-wise at −78° C. under N$_2$ atmosphere. After the solution was stirred for 10 minutes at −78° C., it was allowed to warm to 0° C. and cooled back to −78° C. 2-Isopropoxy-4,4,5,5-tetramethyl[1,3,2]dioxaborolane (3.52 g, 18.9 mmol) was then added drop-wise to the mixture. After the reaction was stirred for 10 minutes −78° C., it was allowed to warm to ambient temperature and stirred for 1.5 hours. The reaction was then quenched by the addition of water (100 cm³). The product was extracted with Et$_2$O (100 cm³). The organic layer was washed with brine (100 cm³), dried over anhydrous MgSO$_4$ and concentrated under reduced pressure. The crude product was purified by crystallization from acetone (50 cm³) twice to give the fluorene diboronester 14 as colorless crystals (3.83 g, 67%); mp 74-76° C. (acetone); (Found: C, 78.0; H, 11.1. C$_{49}$H$_{80}$B$_2$O$_4$ requires C, 78.0; H, 10.7%); NMR (400 MHz, CDCl$_3$, δ) 7.82 (dd, J=1, 7.5 Hz, 2H), 7.76 (s, 2H), 7.74 (dd, J=1, 7.5 Hz, 2H), 2.04-1.98 (m, 4H), 1.41 (s, 24H), 1.32-0.98 (m, 36H), 0.88 (t, J=7 Hz, 6H), 0.56 (s, 4H); m/z (ESI) 755.6 [(M+H)$^+$. C$_{49}$H$_{81}$B$_2$O$_4$: requires M, 755.63].

PF12.

To a Schlenk tube were added dibromofluorene 13 (0.438 g, 0.662 mmol), fluorene diboronester 14 (0.500 g, 0.662 mmol) and Pd(PPh$_3$)$_4$ (0.038 g, 0.033 mmol). The tube was then purged with N$_2$. Toluene (N$_2$ bubbled, 6 cm³) was added and the solution was stirred at 90° C. for 5 minutes. Et$_4$NOH aqueous solution (20% w/w, N$_2$ bubbled, 6 cm³) was then added. After the mixture was stirred for 2 hours at 90° C., a solution of phenylboronic acid (0.080 g, 0.66 mmol) in toluene (1.5 cm³) was added. The reaction was stirred for 1 hour. Bromobenzene (0.21 g, 1.32 mmol) was added to the reaction mixture. After the reaction was stirred for further 2 hours, it was allowed to cool to ambient temperature and poured into stirring MeOH (300 cm³). The precipitate was filtered and dissolved in CHCl$_3$. The solution was passed through a short plug of silica gel with flushing with a copious volume of hexanes and concentrated under reduced pressure. The resulting polymer was dissolved in CHCl$_3$ and precipitated again in stirring MeOH (300 cm³). The filtered polymer was dried under reduced pressure to give PF12 as a pale-yellow fibrous solid (0.40 g); Size exclusion chromatography (THF, polystyrene standard, M$_n$=19000, M$_w$=33000, PDI=1.7); $^1$H NMR (400 MHz, CDCl$_3$, δ) 7.97-7.79 (m, 2H), 7.79-7.65 (m, 4H), 2.15 (br s, 4H), 1.36-1.08 (m, 36H), 0.93-0.84 (m, 10H).

Semi-perfluoroalkyl Fluorene and Benzotriazole Statistical Random Copolymer, P(R$_F$F12-R$_F$BTz). 4,7-Dibromo-2-(5,5,6,6,7,7,8,8,9,9,10,10,11,11,12,12,12-heptadecafluorododecyl)-2H-benzo[1,2,3]triazole 15

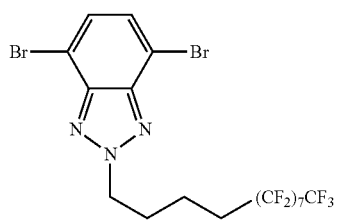

To a magnetically stirred solution of 4,7-dibromobenz[1,2,3]triazole (0.500 g, 1.81 mmol) and 1,1,1,2,2,3,3,4,4,5,5,6,6,7,7,8,8-heptadecafluoro-12-iodododecane 3 (1.21 g, 1.99 mmol) in DMF (7 cm$^3$) was added K$_2$CO$_3$ (0.50 g, 3.6 mmol). The mixture was then heated to 90° C. After the reaction was stirred for 2 hours under a N$_2$ atmosphere, it was allowed to cool to ambient temperature and quenched by the addition of water (50 cm$^3$). The product was extracted with Et$_2$O (50 cm$^3$). The organic layer was then washed with brine (50 cm$^3$), dried over anhydrous MgSO$_4$ and concentrated under reduced pressure. The crude product was purified by flash column chromatography (silica gel, CH$_2$Cl$_2$) to give the dibromobenzotriazole 15 as colorless crystals (0.59 g, 44%); mp 110-111° C. (CH$_2$Cl$_2$); (Found: C, 28.8; H, 1.25; N, 5.7%. C$_{18}$H$_{10}$Br$_2$F$_{17}$N$_3$ requires C, 28.8; H, 1.3; N, 5.6%); IR (KBr) $\nu_{max}$: 2951, 1500, 1248, 1208, 1154, 954, 808, 657 cm$^{-1}$; $^1$H NMR (400 MHz, CDCl$_3$, δ) 7.49 (s, 2H, Ar—H), 4.86 (t, J=7 Hz, 2H, NCH$_2$), 2.33-2.25 (m, 2H, NCH$_2$CH$_2$), 2.24-2.11 (m, 2H, CH$_2$CF$_2$), 1.78-1.70 ppm (m, 2H, CH$_2$CH$_2$CF$_2$); $^{13}$C NMR (101 MHz, CDCl$_3$, δ) 143.8, 129.8, 110.0, 56.6, 30.2 (t, J=23 Hz), 29.4, 17.5 ppm; m/z (ESI) 751.7 [(M+H)$^+$. C$_{18}$H$_{11}$Br$_2$F$_{17}$N$_3$: requires M, 751.9].

P(R$_F$F12-R$_F$BTz) (7:1 R$_F$F12:R$_F$BTz Statistical Random Copolymer)

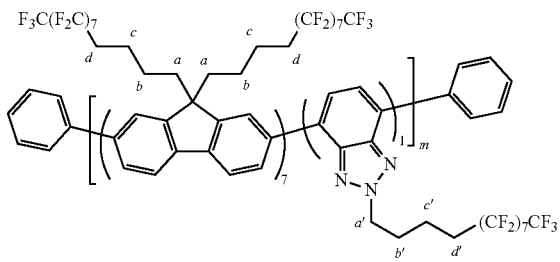

Statistical random copolymer P(R$_F$F12-R$_F$BTz)

To a Schlenk tube were added dibromofluorene 5 (0.271 g, 0.213 mmol), 4,7-dibromobenzotriazole 15 (0.040 g, 0.053 mmol), fluorene diboronester 7 (0.364 g, 0.266 mmol) and Pd(PPh$_3$)$_4$ (0.015 g, 0.013 mmol). The tube was then purged with N$_2$. Benzotrifluoride (N$_2$ bubbled, 5 cm$^3$) was added and the solution was stirred at 90° C. for 5 minutes. Et$_4$NOH aqueous solution (20% w/w, N$_2$ bubbled, 5 cm$^3$) was then added. After the mixture was stirred for 2 hours at 90° C., a solution of phenylboronic acid (0.033 g, 0.27 mmol) in benzotrifluoride (1 cm$^3$) was added. The reaction was stirred for 1 hour. Bromobenzene (0.084 g, 0.53 mmol) was added to the reaction mixture. After the reaction was stirred for further 2 hours, it was allowed to cool to ambient temperature and poured into stirring MeOH (200 cm$^3$). The precipitate was filtered and dissolved in benzotrifluoride again. The solution was passed through a short plug of silica gel with flushing with a copious amount of benzotrifluoride and concentrated under reduced pressure. The resulting polymer was dissolved in benzotrifluoride and precipitated again in stirring MeOH (200 cm$^3$). The filtered polymer was dried under reduced pressure to give the statistical random copolymer P(R$_F$F12-R$_F$BTz) as a pale-yellow fibrous solid (0.48 g); Size exclusion chromatography (M$_n$=26000, M$_w$=54000); The integrated area ratio of protons at (a, b, c, d) and a' on a $^1$H NMR spectrum showed that the mole ratio of R$_F$F12 to R$_F$BTz is roughly 7:1.

Figure 11:
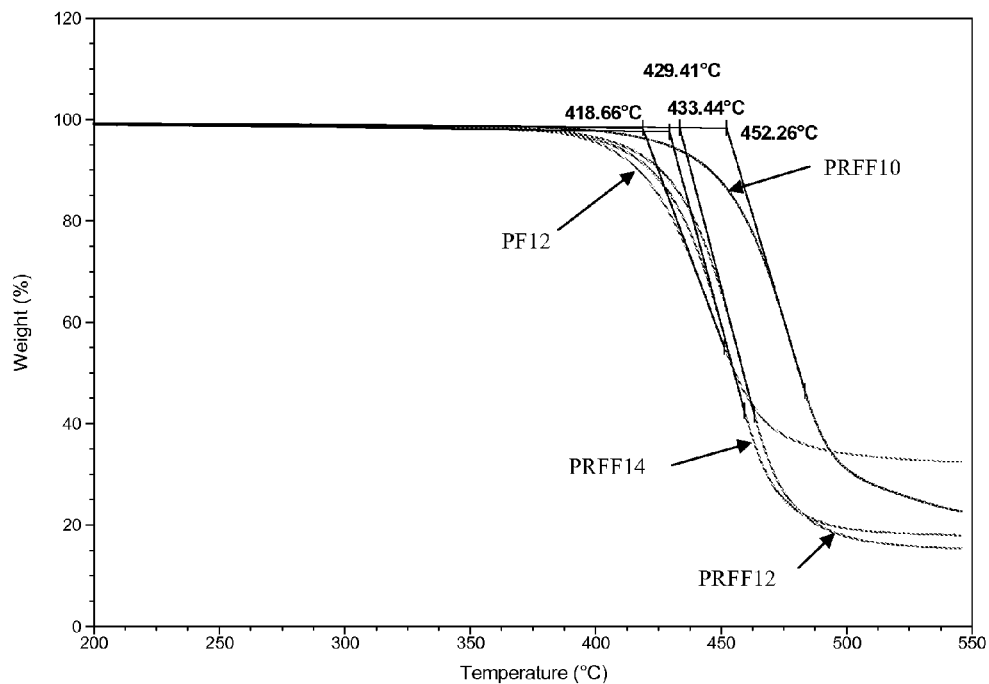
FIG. 11. Example of TGA thermograms of PR$_F$F10, PR$_F$F12, PR$_F$F14 and PF12 (reference). Onset temperatures are annotated.
Figure 12:
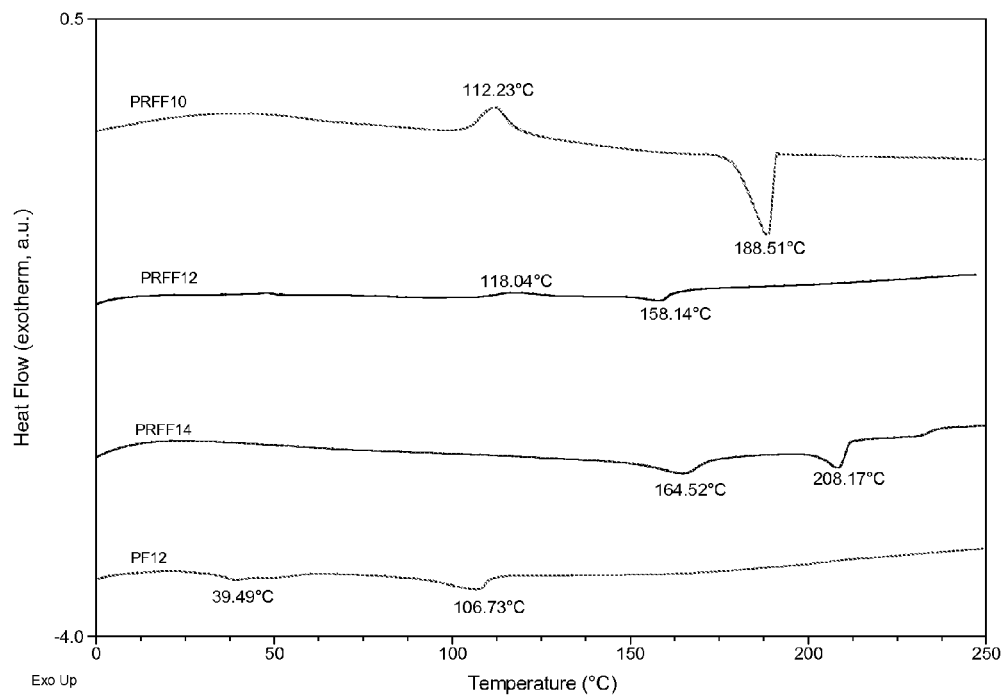
FIG. 12. Examples of DSC thermograms of PR$_F$F10, PR$_F$F12, PR$_F$F14 and PF12 (reference).

Thermal Analysis. TGA (see FIG. 11). DSC (see FIG. 12).

Dissolution Behavior of PR$_F$F12 in Supercritical Carbon Dioxide (scCO$_2$)

TABLE 2

Dissolution behavior of PR$_F$F12 and PF12 in scCO$_2$.

| Polymer[a] | Conditions of scCO$_2$ treatment | Film thickness (nm) | |
|---|---|---|---|
| | | Before dipping in scCO$_2$ | After dipping in scCO$_2$ |
| PR$_F$F12 | 20 MPa, 50° C. for 10 min | 300 | 300 |
| PR$_F$F12 | 34 MPa, 50° C. for 10 min | 300 | 100 |
| PR$_F$F12 | 48 MPa, 50° C. for 10 min | 300 | 60 |
| F12 | 34 MPa, 50° C. for 10 min | 180 | 180 |

[a]PR$_F$F12 was spin coated on a Si wafer which had been treated with trichloro(1H,1H,2H,2H-perfluorooctyl)silane in advance. The spin-coating solvent was benzotrifluoride; PF12 was spin coated on a Si wafer which had been treated with 1,1,1,3,3,3-hexamethyldisilazane in advance. The spin-coating solvent was p-xylene.

Figure 13:
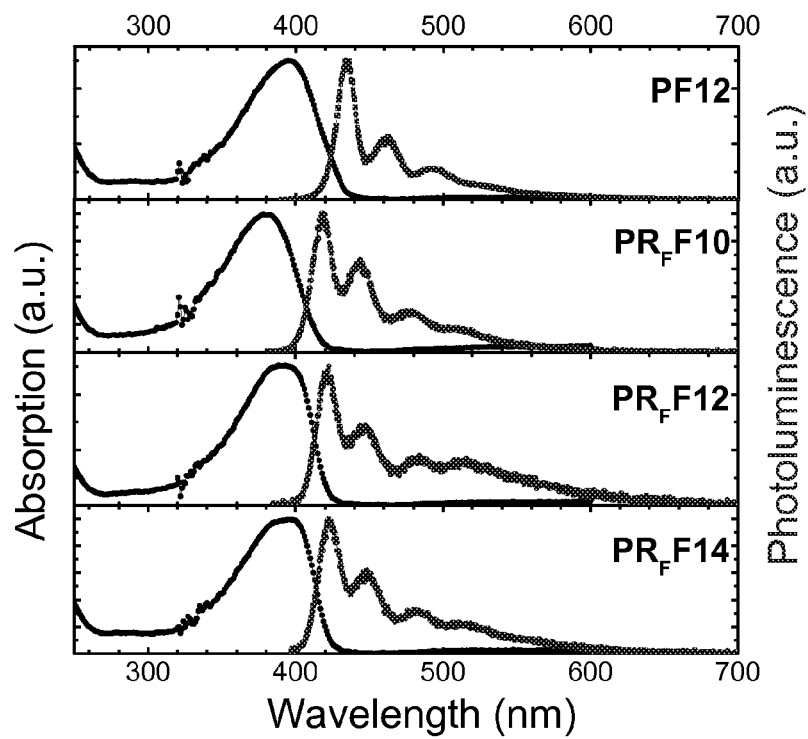
FIG. 13. Example of UV-Vis and PL spectra of PR$_F$F10, PR$_F$F12, PR$_F$F14 and PF12 (reference) in a thin-film state on a quartz window. (Source change at 320 nm)
Figure 14:
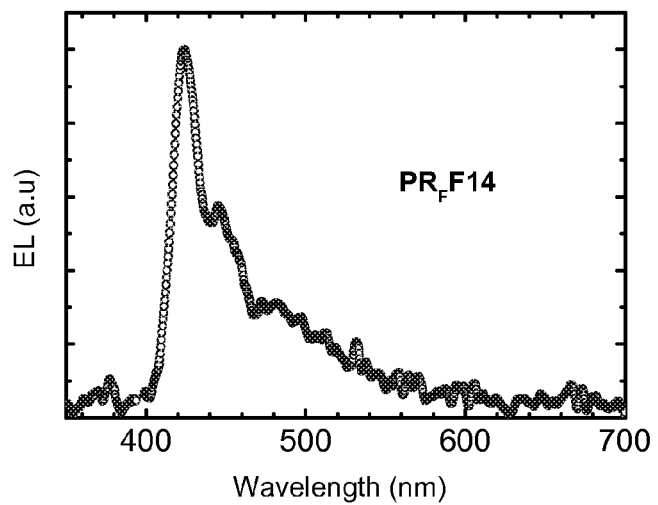
FIG. 14. Example of EL spectrum of PR$_F$F14.

UV-Vis, PL and EL properties characterization. UV-Vis and PL spectra (see FIGS. 13 and 14).

Fabrication of polymer light-emitting devices. Patterned ITO (15-20 Ω/sq) was cleaned by a non-ionic detergent and rinsed with de-ionized water. It was then treated in a UV-ozone cleaner for 10 minutes prior to spin-coating of poly(3,4-ethylenedioxythiophene):poly(styrene sulfonate) (PEDOT:PSS) (H. C. Starck). Filtered PEDOT:PSS was spin-coated at 5000 rpm and subsequently baked at 180° C. for 40 min under a N$_2$ atmosphere. The fluorescent polymers were then spin-coated from their HFE-7500 solutions (in cases of semi-perfluoroalkyl polyfluorenes) or p-xylene solutions (in the case of non-fluorinated polymer) under a N$_2$ atmosphere and further baked at 100° C. for 1 hour prior to the deposition of a top cathode of CsF (1 nm)/Al (40 nm). The deposition rate of CsF was 0.1 nm s$^{-1}$. The sample active area was 0.03 cm$^2$.

Figure 15:
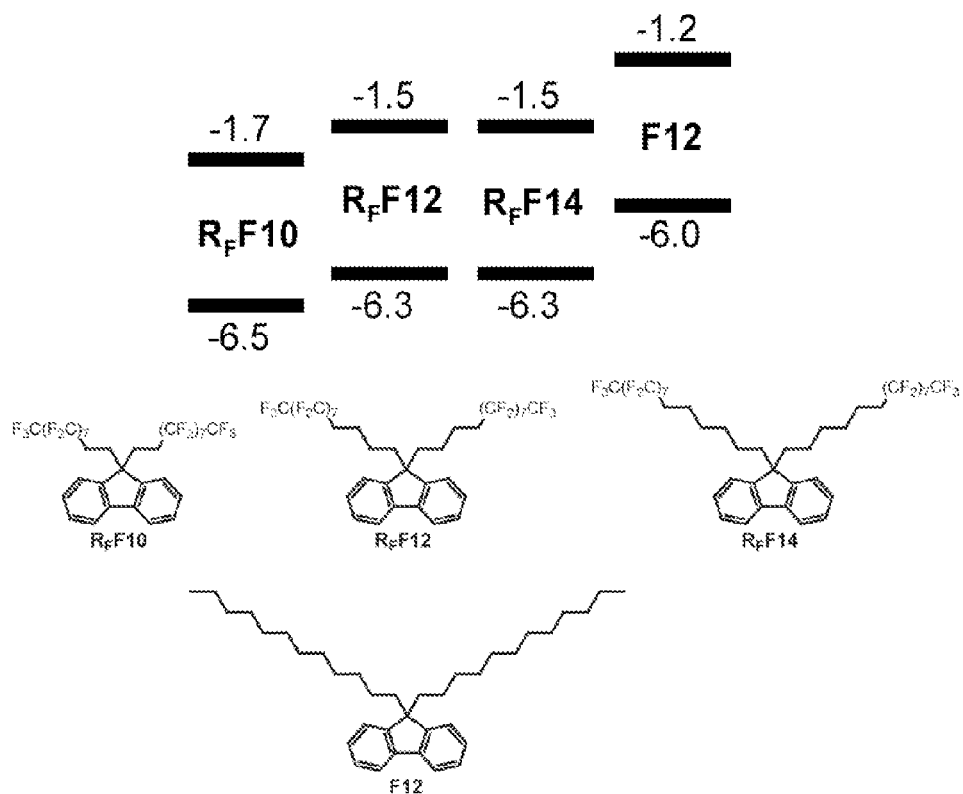
FIG. 15. Example of calculated HOMO and LUMO energy levels (unit is eV) for a single monomer unit R$_F$F10, R$_F$F12, R$_F$F14 and F12 vs. vacuum level.

Computational methodology. The ground-state geometries of the monomer units are optimized at the semi-empirical Hartree-Fock Austin Model 1 (AM1) level.[6] The Kohn-Shan energy levels are calculated through restricted B3LYP/6-31G (d',p') hybrid functional, based on the optimized geometries obtained at the AM1 level. (See, e.g., FIG. 15)

Figure 16:
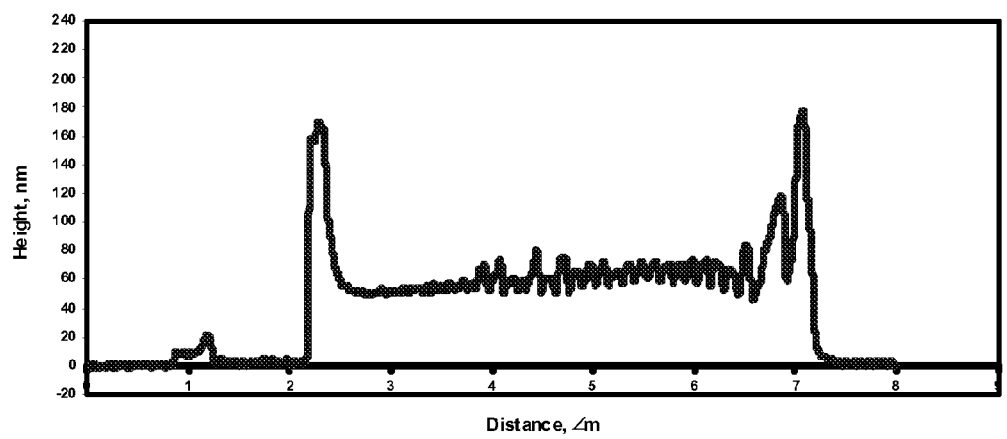
FIG. 16. Example of surface profile of the patterned PR$_F$F12 image.

Lift-off patterning of PR$_F$F12. On a Si wafer, a commercially available photoresist (Shipley SPR 1827) was spin-coated to make a 3 μm thick film. After post-apply bake, the resist film was exposed with a UV light through a photomask. That wafer then underwent a NH$_3$-based image reversal process to generate an undercut resist image profile for facile lift-off patterning. Subsequent flood exposure and development in an aqueous base solution (AZ 300 MIF) produced a stencil for the patterning of a $PR_FF12$ film. After a treatment of the wafer with trichloro(1H,1H,2H,2H-perfluorooctyl)silane vapor, $PR_FF12$ solution in HFE-7500 was spin-coated to give ca. 50 nm thick film. The wafer was then emerged into acetone for 1 minute to remove the photoresist film. Resulting $PR_FF12$ image was examined under a fluorescence microscope. (See, e.g., FIG. 16)

EXAMPLE 2

In this example, demonstrated are: 1) forming a multi-layer solution-processed device, and 2) direct photolithographic patterning of light-emitting layers without compromising the device efficiency. Described herein is the synthesis and characterization of examples of a highly fluorinated light-emitting polymer (RF-LEP) family that contains semi-perfluoroalkyl side chains. These RF-LEPs are designed to be soluble in fluorinated solvents, such as bis(trifluoromethyl)benzene (BTMB) and hydrofluoroethers (HFEs), but insoluble in common organic solvents, including xylene, toluene, and chlorinated solvents. The sufficiently high fluorine content of these polymers (similar to fluoropolymers like Teflon™) leads to advantageous thin film properties such as a hydrophobic surface that repels moisture, and resistance to standard water-based alkaline photoresist developers such as 0.26 N tetramethyl ammonium hydroxide (TMAH) solution. Furthermore, this fluorous surface is also lipophobic, which makes it robust against common organic solvents as well as conventional photoresist solutions formulated in propylene glycol methyl ether acetate (PGMEA). As such, current well-established lithographic patterning techniques can be directly employed on the RF-LEPs without the addition of cross-linking functionalities, protective layers, special engineering of imaging materials or the use of special photoresists and solvents, which makes these polymers attractive candidates for use in large area full-colour OLED displays. The orthogonal property of the RF-LEPs also implies that they can form multiple layers with conventional light-emitting materials by solution processing without detrimental side effects on materials performance.

Figure 17:
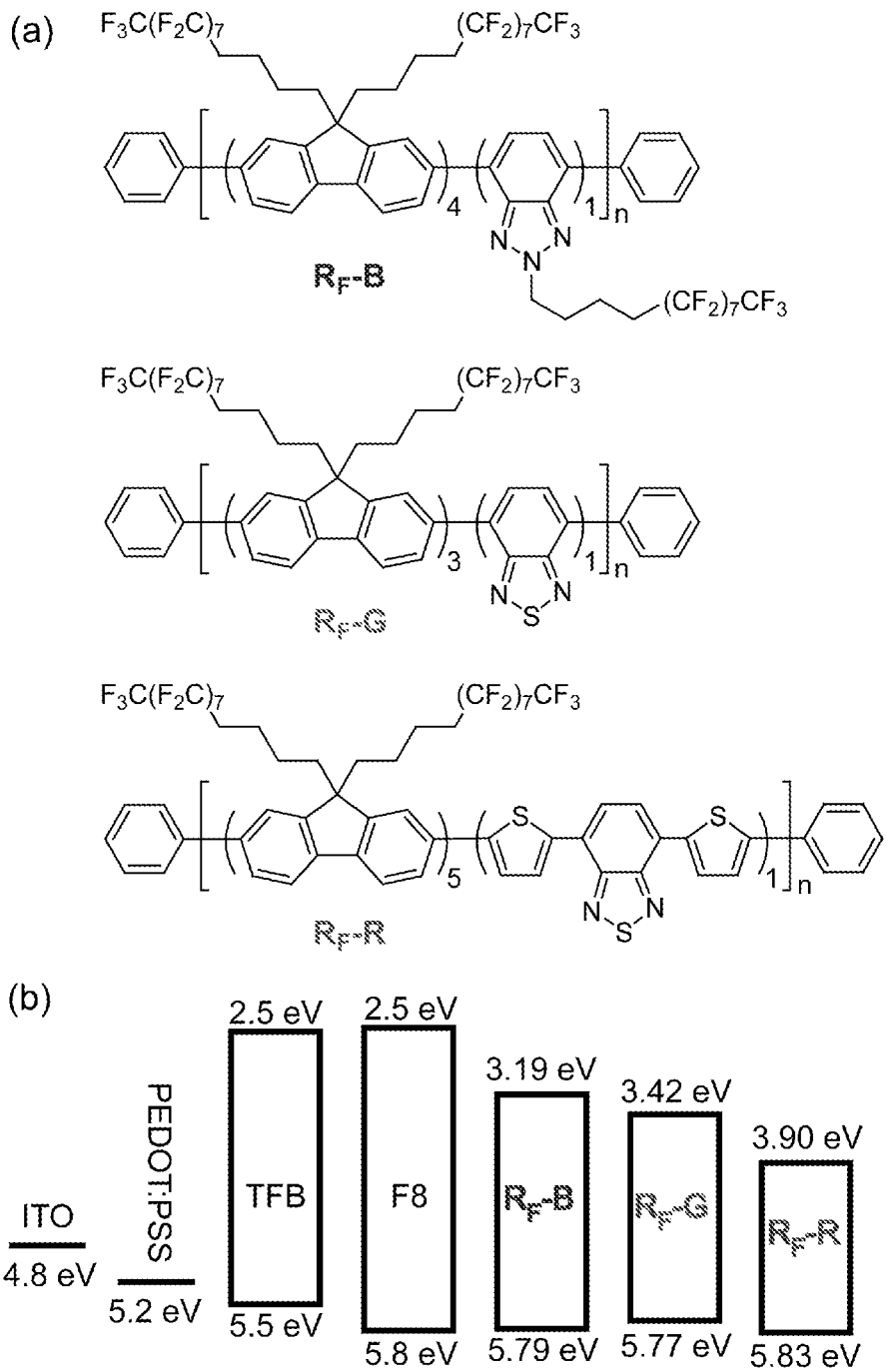
FIG. 17. (a) Examples of polymer structures of R$_F$-B, R$_F$-G and R$_F$-R polymers. (b) An energy diagram of ITO, PEDOT:PSS, poly[(9,9-dioctylfluorene)-co-(4-butylphenyl-diphenylamine)] (TFB), Poly(9,9-dioctylfluorene) (F8), R$_F$-B, R$_F$-G, R$_F$-R, and Ca.

We observed blue emission from a PLED fabricated from a semi-perfluoroalkyl polyfluorene, but the electroluminescence (EL) performance was not desirable. Incorporation of a small amount of the electron-accepting comonomer benzotriazole (BTz) into the polymer backbone was shown to improve the EL performance. The fraction of the BTz comonomer of this blue-emitting polymer was further increased, hereafter referred to as RF-B. Two new RF-LEPs for green (RF-G) and red (RF-R) emission are also synthesized by replacing the BTz comonomer with benzothiadiazole (BT) and thiophene-benzothiadiazole-thiophene (TBT), respectively. FIG. 17(a) shows the chemical structures of highly fluorinated polymers RF-B, RF-G, and RF-R. Details of the synthesis of these polymers can be found in the supporting information. The fluorine content of these polymers is ca. 58% (RF-B), 56% (RF-G), and 55% (RF-R). All these polymers consist of semi-perfluoroalkyl side chains of $(CH_2)_4(C_8F_{17})$ to facilitate dissolution in fluorinated solvents. The highest occupied molecular orbital (HOMO) of the RF-LEPs is around 5.8 eV, observed by photoelectron spectroscopy in air (PESA). The lowest unoccupied molecular orbital (LUMO) varies from 3.2 to 3.9 eV (estimated by adding the optical band gap to the HOMO value), as shown in FIG. 17(b). Electron injection into these RF-LEPs from various low work function metal cathodes is thus energetically favourable.

Single layer devices for each colour have a structure of ITO/PEDOT:PSS (Al4083) (40 nm)/RF-LEP (160 nm for RF-R, 165 nm for RF-G, 100 nm for RF-B)/Ca (2 nm)/Al (40 nm). FIGS. 18(a)-(b) show the current-voltage-luminescence (IVL) characteristics of the single layer devices. Devices have turn-on voltages (defined by luminance of 1 cd/m$^2$) of 4 V, 6 V, and 4.5 V for RF-R, RF-G and RF-B, respectively. The corresponding current efficiencies are 0.75 cd/A, 6.8 cd/A, and 0.15 cd/A at the current density of 1 mA/cm$^2$, with peak electroluminescence (EL) at 632 nm (RF-R), 535 nm (RF-G), and 482 nm (RF-B), as shown in FIGS. 18(c)-(d), respectively. In particular, the single layer RF-G device performance compares favorably to the 5-10 cd/A efficiency achieved by high performance PLEDs based on poly(9,9-dioctylfluorene-alt-benzothiadiazole) (F8BT), which is the analogous non-fluorinated polymer. Their corresponding absorption spectra are shown in FIG. 18(e), illustrating their respective optical band gaps of 1.9, 2.4, 2.6 eV, extracted through the Tauc plot given in the inset. Apparently, the semi-perfluoroalkyl side chains do not significantly influence the frontier orbitals when compared to non-fluorinated polymers, which is likely due to the dominant contributions of the respective electron-abstracting comonomer units of TBT, BT and BTz.

Figure 19:
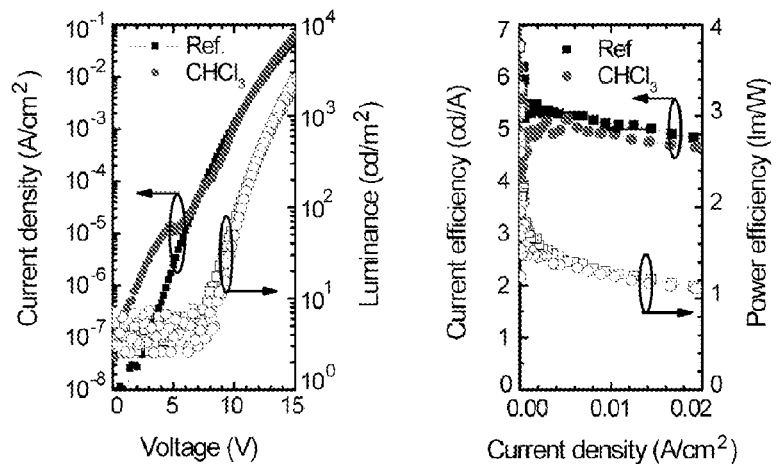
FIG. 19. Example of operation of a single layer R$_F$-G device after chloroform immersion. Example of current-voltage-luminescence characteristics and current efficiency of immersed and reference devices.

Using RF-G as an example, we demonstrate the chemical stability of this RF-LEP family. FIG. 19 shows the IVL and current efficiency of a single layer RF-G device (ITO/PEDOT:PSS/RF-G/Ca/Al) which has been immersed in chloroform for 5 minutes, together with that of a pristine reference device. It is clear that there is negligible device degradation after chloroform immersion. Similarly, the device dipped into chloroform prior to the deposition of Ca/Al cathode performs as good as the corresponding reference device. In general, we have found this RF-LEP family to be robust against all ordinary organic and polar solvents, including xylene, toluene, acetone, isopropanol, water and even chloroform.

Figure 18:
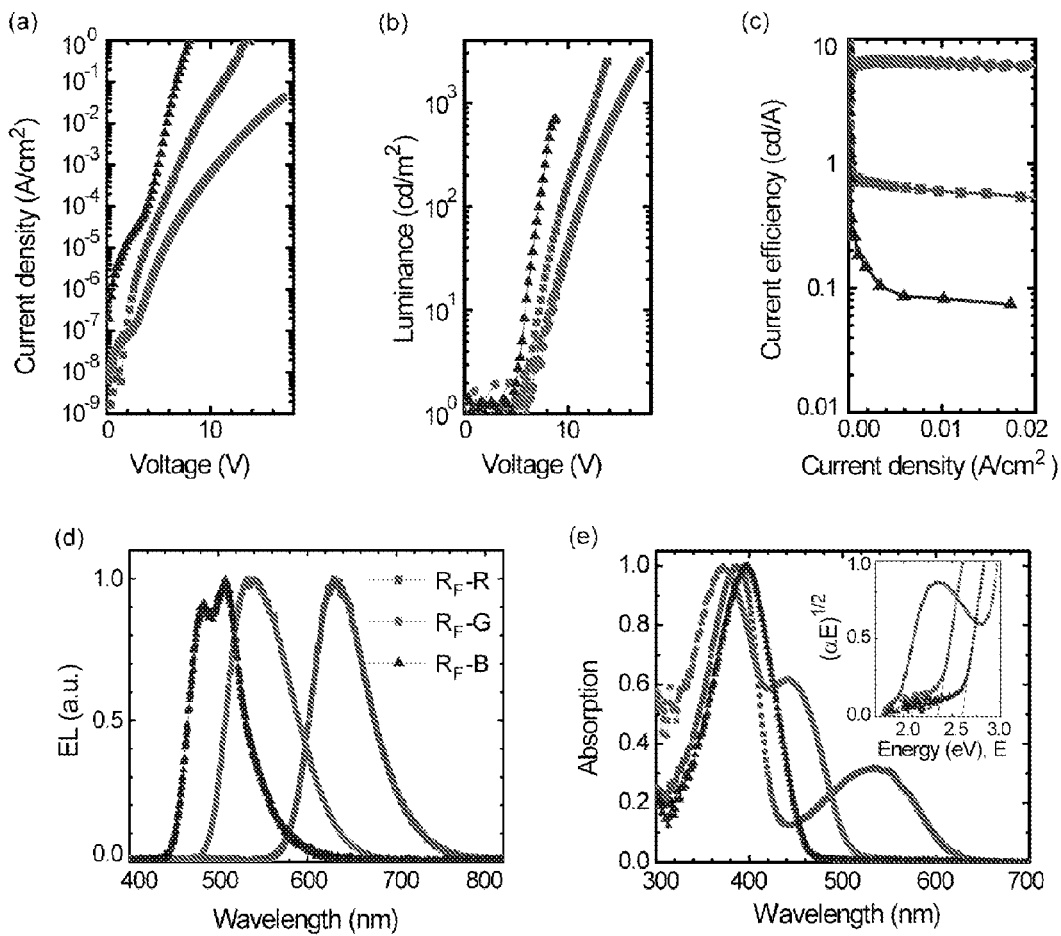
FIG. 18. Example of single-layer R$_F$-LEP devices of R$_F$-B, R$_F$-G and R$_F$-R (a) Example of current-voltage characteristics, (b) Example of luminance-voltage characteristics, (c) Example of current efficiency, (d) Example of EL spectra, and (e) Example of absorption spectra.
Figure 20:
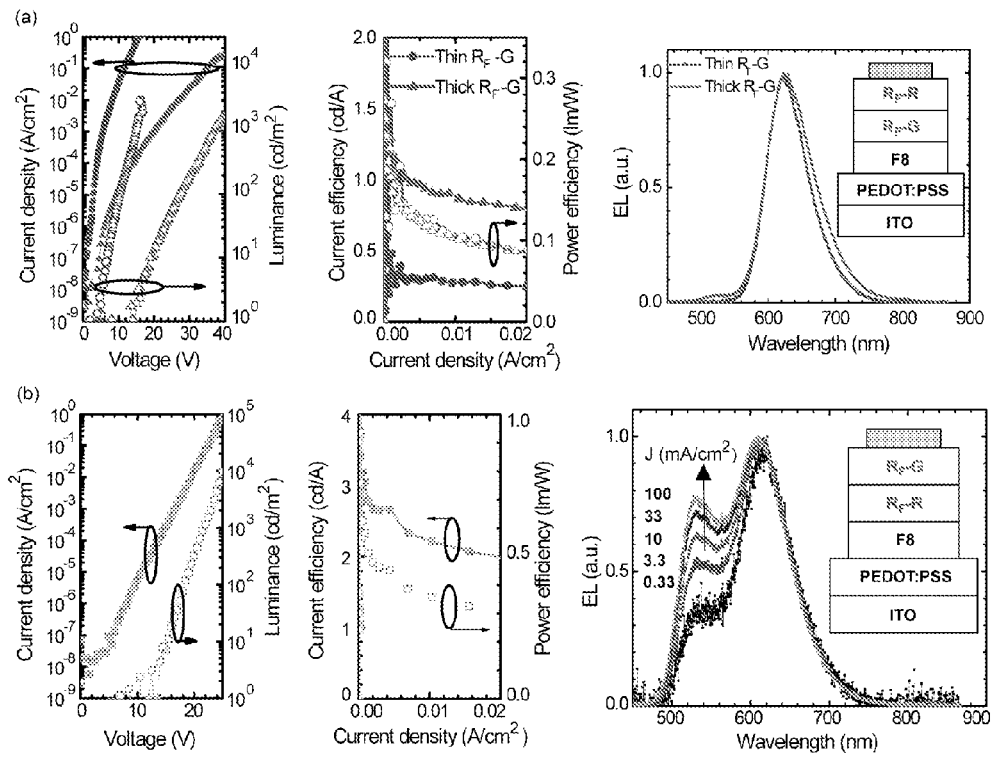
FIG. 20. Examples of device characteristics of multilayer devices. (a) Tri-layer F8/R$_F$-G/R$_F$-R devices, with comparison between thin (60 nm) and thick (160 nm) R$_F$-G layers (device structure shown in inset). (b) Tri-layer F8/R$_F$-R/R$_F$-G devices (device structure shown in inset).

We also demonstrate another processing capability of these RF-LEPs, namely self-stacking of multiple layers. By using bis(trifluoromethyl)benzene (BTMB) instead of the more aggressive benzotrifluoride (BTF) as a solvent, RF-LEPs can be stacked by spin-coating to form bi-layers. For example, we demonstrate two devices with a three-LEP stack as shown in FIG. 20. FIG. 20(a) illustrates the device characteristics of a tri-layer red-emitting device with a thin RF-R layer on top of a thin RF-G layer (60 nm), and PEDOT:PSS/F8 (40 nm) as the underlying layers. Due to smaller band gap and lower-lying LUMO of RF-R, the light emission is fully confined at RF-R, showing an EL peak at 620 nm. The corresponding luminous efficiency is 0.3 cd/A with a turn-on voltage (VON) identical to that of the reference RF-R device shown in FIG. 18. Clearly, holes are injected just as efficiently into the RF-R layer through F8 and RF-G at this driving voltage, which can be explained by their similar HOMO energy levels. We further increase the thickness of the RF-G layer to 160 nm until the recombination shifts to the RF-G/RF-R interface. This shift is verified by an observable EL shoulder occurring at 535 nm, corresponding to RF-G emission. With this thick RF-G middle layer, the luminous efficiency is then increased to ca. 1.2 cd/A (0.9% EQE), 60% higher than the RF-R reference device (0.75 cd/A, 0.25% EQE as shown in FIG. 18). Another observation is that a thicker RF-G layer leads to a shift in VON to 14 V, suggesting a significant reduction of the hole current. FIG. 20(b) depicts the device characteristics of another tri-layer device with a reverse stack where a RF-G layer is deposited on top of RF-R, showing efficiencies of ca. 3 cd/A and 2.5 μm/W with an orange emission due to the light emission from both the RF-R and RF-G layers. It can be seen that the recombination zone shifts toward RF-G when the driving current increases from 0.33 to 100 mA/cm², illustrating that hole injection is further enhanced at higher voltage. Clearly, these two devices demonstrate the capability of RF-LEPs to form multi-layered solution-processed devices.

Figure 21:
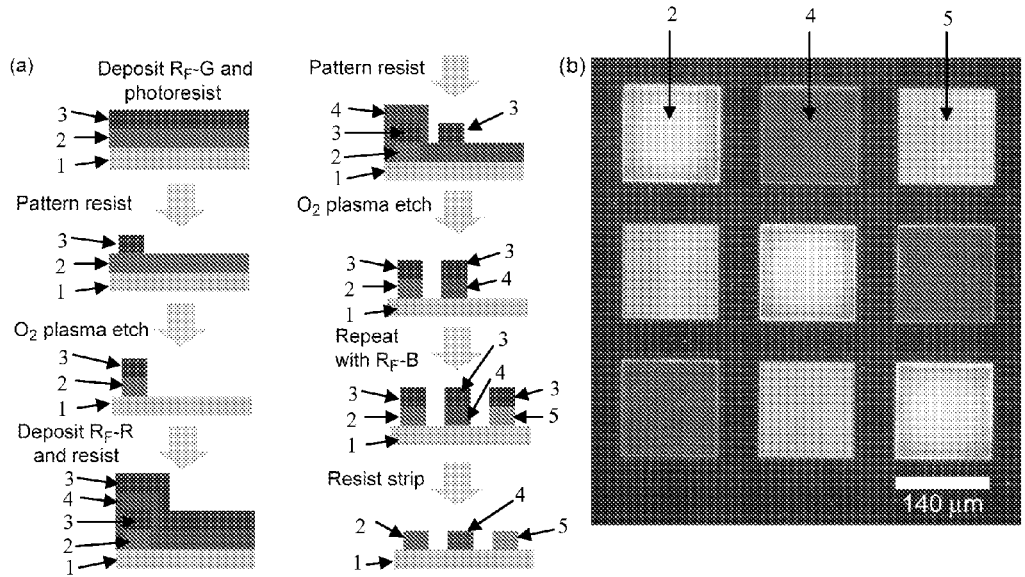
FIG. 21. (a) Example of a schematic diagram of patterning process for RGB array via a dry etch process. (b) Example of photoluminescence image of RGB individual 3×3 pixel array.

We further demonstrate the capability of this RF-LEP family to be processed and patterned via standard photolithographic techniques that involves direct contact of RF-LEP with a photoresist solution in PGMEA and aqueous base developer. For example, a 3×3 RGB pixel array has been fabricated using the dry etch approach. A schematic of the patterning process is shown in FIG. 21(a). The photoresist used in this process is the commercially available negative-tone AZ nLOF 2020. No special considerations have been made in the choice of this resist, other than its negative-tone property since it needs to remain intact during subsequent exposure and developing steps. The standard water-based developer is used for resist development after selective exposure. Pattern transfer from the photoresist to the polymer is achieved by dry etching in oxygen plasma, and the photoresist that remained after the etching step is sufficient to protect the underlying polymer during the spin coating of the next layer. FIG. 21(b) shows a photoluminescence (PL) image of the patterned RGB array under ultraviolet light (365 nm). Each pixel is 140 µm by 140 µm in size. These patterned RGB pixels demonstrate the viability of patterning RF-LEP using an ordinary photolithographic approach employing organic solvents and aqueous photoresist processing conditions.

The fluorinated functional materials have been shown to be robust and exhibit high chemical stability. These unique properties provide great flexibility in device structure design and processing. These methods and materials are of interest to, for example, to the large-area, flexible electronics community.

Experimental

RGB PLED fabrication procedure. Devices have a structure of ITO/PEDOT:PSS (AI4083) (40 nm)/RF-R or RF-G or RF-B/Ca (20 nm)/Al (40 nm). Fluorinated light emitting polymers (RF-LEPs) can be dissolved in a variety of fluorinated solvents, including hydrofluoroethers (HFEs), bis(trifluoromethyl)benzene (BTMB), and benzotrifluoride (BTF) (with increasing levels of solubility), or their mixtures. Pre-patterned indium-tin-oxide (ITO) glass (<20 ohm/sq, Kintec Company) was cleaned by sonication in non-ionic detergent, rinsed in de-ionized water, dried in a $N_2$ stream and treated with a 10-minute UV-ozone exposure. Filtered PEDOT:PSS aqueous solution (Clevois AI4083) was spin-coated on top of the patterned ITO glass at 5000 rpm and baked at 180° C. for 40 minutes in air. RF-LEP was dissolved at a concentration of 10-20 mg/mL in the solvents mentioned above by stirring at room temperature. The polymer solutions were then spin-coated without further filtration to form films with thickness ranging from 100-200 nm, which were baked at 100° C. for 15 minutes in $N_2$. Top Ca/Al cathode was thermally evaporated at a base pressure of 10-6 Torr at a rate of 0.2 nm/s and 0.1 nm/s, respectively.

Tri-layer red-emitting device has a structure of ITO/PEDOT:PSS (AI4083)/F8/RF-G/RF-R/Ca (20 nm)/Al (40 nm) while the orange-emitting device has a structure of ITO/PEDOT:PSS (AI4083)/F8/RF-R/RF-G/Ca (20 nm)/Al (40 nm). ITO glass substrates and PEDOT:PSS layers were prepared as above. The first buffer layer of 40 nm thick poly(9,9-dioctylfluorene) (F8) was formed by spin-coating at 2000 rpm from a 10 mg/ml solution in p-xylene, and then baked at 130° C. for 15 min in $N_2$. In the case of the tri-layer red-emitting device, the first LEP layer was spin-coated at 700 rpm from a RF-G solution of either 5 or 20 mg/mL in BTF to form a thin (60 nm) or a thick (160 nm) RF-G film respectively. This RF-G layer is further baked at 150° C. for 30 min in $N_2$. A second layer of RF-R was then spin-coated at 700 rpm from a RF-R solution of 7.5 mg/mL in BTMB. In the case of the tri-layer orange-emitting device, the RF-R layer was spin-coated at 1500 rpm from a 7.5 mg/mL solution in BTMB to form a 20 nm film, and baked at 150° C. for 30 min in $N_2$. The second layer of RF-G is then spin-coated at 700 rpm from a 10 mg/mL solution in BTMB and further baked at 150° C. for 15 min in $N_2$.

The device current-voltage characteristics were acquired by a computer-controlled Keithley 236 source measurement unit (SMU) while the corresponding radiance was measured using an integrating sphere (Labsphere) housed with a calibrated silicon photodiode. The electroluminescence was measured at a driving current of 0.3-100 mA/cm² through a fibre optic spectrometer (Oceanoptics USB2000).

RGB patterning procedure. The RF-LEPs were each dissolved in benzotrifluoride (BTF) to make solutions with concentrations of 10 mg/mL. Glass substrates are cleaned using the same procedure as above. RF-G solution was spin-coated onto the substrate at 1500 rpm, and then baked at 130° C. for 15 minutes. AZ nLOF 2020 photoresist was then spin-coated on top of the polymer film at 2000 rpm. A brief, 5-second oxygen plasma treatment was performed on the RF-G layer prior to photoresist application to improve the adhesion of the 2 layers. The photoresist was selectively exposed using a GCA Autostep 200 DSW i-line Wafer Stepper (λ=365 nm), and then developed with AZ 300 MIF developer (0.26 N tetramethylammonium hydroxide aqueous solution). Pattern transfer from the photoresist image to the RF-G was achieved by dry etching in oxygen plasma using an Oxford PlasmaLab 80+ RIE System. RF-R solution was then spin-coated on top of the patterned RF-G pixels, and the same procedure was repeated. Finally, RF-B solution was spin-coated on top of the patterned RF-G and RF-R pixels and then patterned as above, to produce the green, red and blue pixels. Remaining photoresist was removed with Shipley Microposit 1165 resist remover and acetone.

While the invention has been particularly shown and described with reference to specific embodiments (some of which are preferred embodiments), it should be understood by those having skill in the art that various changes in form and detail may be made therein without departing from the spirit and scope of the present invention as disclosed herein.

What is claimed is:

1. A method for obtaining a patterned structure comprising a fluorine-containing polymeric material comprising the steps of:
    a) coating a substrate with a layer of fluorine-containing polymeric material;
    b) coating the substrate from a) with a layer of photoresist material;
    c) selectively exposing portions of the layer of photoresist material from step b) to radiation forming a first pattern of exposed photoresist material and a second pattern of unexposed photoresist material;
    d) selectively removing either the first pattern of exposed photoresist material or the second pattern of unexposed photoresist material resulting in a residual pattern in the photoresist layer; and
    e) transferring the residual pattern of the photoresist layer from step d) to the layer of fluorine-containing polymeric material,
such that a patterned structure comprising a fluorine-containing polymeric material is formed.

2. The method of claim 1, wherein the transferring of step e) is carried out by dry etch processing.

3. The method of claim 1, wherein the fluorine-containing polymeric material comprises a fluorine-containing polymer or fluorine-containing copolymer.

4. The method of claim 3, wherein the fluorine-containing polymer or fluorine-containing copolymer comprises 20% or more fluorine by weight.

5. The method of claim 3, wherein the fluorine-containing polymer or copolymer is formed at least in part from a fluorine-containing monomer comprising an active-moitety and a fluorine-containing moiety, wherein all of the fluorine in the fluorine-containing monomer is located in the fluorine-containing moiety.

6. The method of claim 5, wherein the fluorine-containing moiety is attached to the active moiety by an alkyl spacer moiety comprising from 1 carbon to 10 carbons.

7. The method of claim 3, wherein the fluorine-containing polymer or fluorine-containing copolymer comprises a moiety selected from benzotriazole, benzothiadiazole, thiophene-benzothiadiazole-thiophene moiety and combinations thereof.

8. The method of claim 1, wherein the fluorine-containing material is a polymer having the following structure:

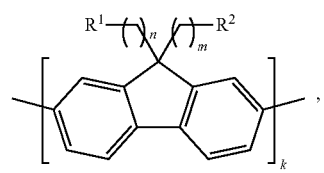

wherein $R^1$ and $R^2$ are each independently a perfluoroalkyl moiety comprising from 1 carbon to 12 carbons,
wherein n and m are each independently from 1 to 10, and
wherein k is from 2 to 1,000.

9. The method of claim 1, wherein the fluorine-containing material is a copolymer having the following structure:

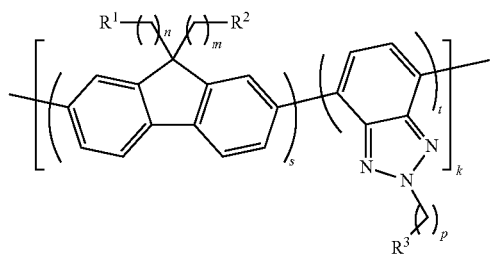

wherein $R^1$, $R^2$ and $R^3$ are each independently a perfluoroalkyl moiety comprising from 1 carbon to 12 carbons,
wherein n, m and p are each independently from 1 to 10,
wherein s and t are independently from 1 to 20, and
wherein k is from 2 to 1,000.

10. A method for obtaining a patterned structure comprising a fluorine-containing polymeric material comprising the steps of:
a) coating a substrate with a layer of photoresist material;
b) selectively exposing portions of the layer of photoresist material from a) to radiation forming a first pattern of exposed photoresist material and a second pattern of unexposed photoresist material;
c) selectively removing either the first pattern of exposed photoresist material or the second pattern of unexposed photoresist material resulting in a residual pattern in the photoresist layer;
d) coating the substrate from c) with a layer of fluorine-containing polymeric material; and
e) removing the residual pattern of photoresist material and fluorine-containing polymeric material corresponding to the residual pattern of photoresist material leaving a second residual pattern of fluorine-containing polymeric material on the substrate, such that a patterned structure comprising a fluorine-containing polymeric material is formed.

11. The method of claim 10, wherein the fluorine-containing polymeric material comprises a fluorine-containing polymer or fluorine-containing copolymer.

12. The method of claim 11, wherein the fluorine-containing polymer or fluorine-containing copolymer comprises 20% or more fluorine by weight.

13. The method of claim 12, wherein the fluorine-containing polymer or fluorine-containing copolymer is formed from a fluorine-containing monomer comprising an active-moitety and a fluorine-containing moiety, and wherein all of the fluorine in the fluorine-containing monomer is located in the fluorine-containing moiety.

14. The method of claim 13, wherein the fluorine-containing moiety is attached to the active moiety by an alkyl spacer moiety comprising from 1 carbon to 10 carbons.

15. The method of claim 11, wherein the fluorine-containing polymer or fluorine-containing copolymer comprises a moiety selected from benzotriazole, benzothiadiazole, thiophene-benzothiadiazole-thiophene moiety and combinations thereof.

16. The method of claim 10, wherein the fluorine-containing material is a polymer having the following structure:

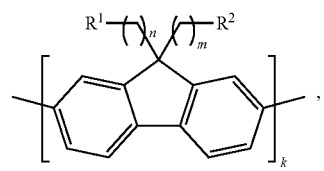

wherein $R^1$ and $R^2$ are each independently a perfluoroalkyl moiety comprising from 1 carbon to 12 carbons,
wherein n and m are each independently from 1 to 10, and
wherein k is from 2 to 1,000.

17. The method of claim 10, wherein the fluorine-containing material is a copolymer having the following structure:

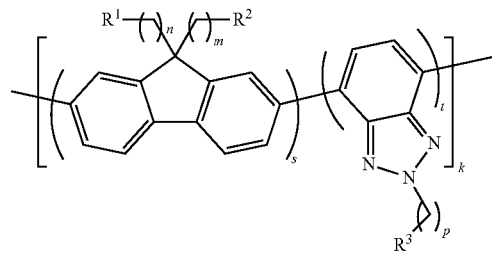

wherein $R^{40}$, $R^{40}$ and $R^{40}$ are each independently a perfluoroalkyl moiety comprising from 1 carbon to 12 carbons,
wherein n, m and p are each independently from 1 to 10,
wherein s and t are independently from 1 to 20, and
wherein k is from 2 to 1,000.

18. A device comprising the patterned structure of fluorine-containing polymeric material obtained by a method comprising the steps of:

a) coating a substrate with a layer of fluorine-containing polymeric material;

b) coating the substrate from a) with a layer of photoresist material;

c) selectively exposing portions of the layer of photoresist material from step b) to radiation forming a first pattern of exposed photoresist material and a second pattern of unexposed photoresist material;

d) selectively removing either the first pattern of exposed photoresist material or the second pattern of unexposed photoresist material resulting in a residual pattern in the photoresist layer; and e) transferring the residual pattern of the photoresist layer from step d) to the layer of fluorine-containing polymeric material, or a') coating a substrate with a layer of photoresist material;

b') selectively exposing portions of the layer of photoresist material from a') to radiation forming a first pattern of exposed photoresist material and a second pattern of unexposed photoresist material;

c') selectively removing either the first pattern of exposed photoresist material or the second pattern of unexposed photoresist material resulting in a residual pattern in the photoresist layer;

d') coating the substrate from c') with a layer of fluorine-containing polymeric material; and e') removing the residual pattern of photoresist material and fluorine-containing polymeric material corresponding to the residual pattern of photoresist material leaving a second residual pattern of fluorine-containing polymeric material on the substrate, such that a patterned structure comprising a fluorine-containing polymeric material is formed.

19. The device of claim 18, wherein the device comprises three patterned fluorine-containing organic structure layers, wherein a first layer is capable of emitting red light, wherein a second layer is capable of emitting green light, and a third layer is capable of emitting blue light.

20. The device of claim 19, wherein all three individual patterned fluorine-containing organic structure layers have the same pattern and are stacked such that the resulting composite pattern is the same as any of the individual layer patterns.

* * * * *

UNITED STATES PATENT AND TRADEMARK OFFICE
CERTIFICATE OF CORRECTION

PATENT NO. : 8,809,111 B2
APPLICATION NO. : 13/502584
DATED : August 19, 2014
INVENTOR(S) : Ober et al.

Page 1 of 1

It is certified that error appears in the above-identified patent and that said Letters Patent is hereby corrected as shown below:

In the claims:

Column 28, line 60, in claim 17, "$R^{40}$, $R^{40}$ and $R^{40}$" should read:

--$R^1$, $R^2$ and $R^3$--.

Signed and Sealed this
Twenty-eighth Day of April, 2015

Michelle K. Lee
*Director of the United States Patent and Trademark Office*